United States Patent [19]

Pennebaker et al.

[11] Patent Number: 4,935,882
[45] Date of Patent: Jun. 19, 1990

[54] PROBABILITY ADAPTATION FOR ARITHMETIC CODERS

[75] Inventors: William B. Pennebaker, Carmel; Joan L. Mitchell, Ossining, both of N.Y.

[73] Assignee: International Business Machines Corporation, Armonk, N.Y.

[21] Appl. No.: 222,332

[22] Filed: Jul. 20, 1988

Related U.S. Application Data

[63] Continuation of Ser. No. 907,695, Sep. 15, 1986, abandoned.

[51] Int. Cl.$^5$ .................... G06F 15/36; G06F 7/10
[52] U.S. Cl. ................... 364/554; 364/224.1; 364/921.91
[58] Field of Search .............. 364/200, 300, 900, 554, 364/715, 717; 341/60; 358/135, 260; 375/122

[56] References Cited

U.S. PATENT DOCUMENTS

| | | | |
|---|---|---|---|
| 4,028,731 | 6/1977 | Arps et al. | 341/51 |
| 4,122,440 | 10/1978 | Langdon, Jr. et al. | 341/51 |
| 4,168,513 | 9/1979 | Hains et al. | 341/107 |
| 4,259,693 | 3/1981 | Aaron et al. | 358/261.2 |
| 4,285,049 | 8/1981 | Bird et al. | 364/900 |
| 4,286,256 | 8/1981 | Langdon, Jr. et al. | 341/107 |
| 4,295,125 | 10/1981 | Langdon, Jr. | 341/50 |
| 4,363,036 | 12/1982 | Subramaniam | 358/261.2 |
| 4,369,463 | 1/1983 | Anastassiou et al. | 358/260 |
| 4,426,731 | 1/1984 | Edlund et al. | 341/63 |
| 4,462,081 | 7/1984 | Lehan | 364/554 |
| 4,467,317 | 8/1984 | Langdon, Jr. et al. | 341/107 |
| 4,488,143 | 12/1984 | Martin | 341/59 |
| 4,591,908 | 5/1986 | Hirano | 358/136 |
| 4,633,490 | 12/1986 | Goertzel et al. | 358/135 |
| 4,652,856 | 3/1987 | Mohiuddin et al. | 341/60 |
| 4,672,539 | 6/1987 | Goertzel | 364/300 |

OTHER PUBLICATIONS

J. Rissanen–Combinatorial Coding, Conditional Entropy, and Distance For Sequences (RJ1538), 2/75.
G. N. N. Martin,–Range Encoding: An Algorithm For Removing Redundancy From a Digitized Message.–7/79.
J. Rissanen–Arithmetic Coding of Strings,–6/75 (RJ1591).
J. Rissanen, G. Langdon, Jr.–Arithmetic Coding (RJ2174), 1/30/78.
F. Barsi and P. Maestrini–Arithmetic Codes in Residue Number Systems–(1978), Digital Processes.
M. Boyarinov, G. A. Kabatyanskil–Iterative Arithmetic Independent–Error Correcting Codes–(1979).
F. Rubin–Arithmetic Stream Coding Using Fixed Precision Registers, IEEE, 1979.
G. G. Langdon, Jr., J. J. Rissanen–Method For Converting Counts to Coding Parameters,–IBM TDB, vol. 22, No. 7, 12/79.
G. G. Langdon, Jr., J. J. Rissanen–Integer–Length Arithmetic Code For Conditional Binary Sources–,–IBM TDB, vol. 22, No. 10, 3/80.

(List continued on next page.)

*Primary Examiner*—Felix D. Gruber
*Attorney, Agent, or Firm*—Marc A. Block; Thomas P. Dowd

[57] ABSTRACT

Apparatus and method for adapting the estimated probability of either the less likely or more likely outcome (event) of a binary decision in a sequence of binary decisions involves the up-dating of the estimated probability in response to the renormalization of an augend A. The augend A changes value with each binary decision, the size of the change depending on which of the binary events has occurred as input. Re-normalization of A occurs when the A value becomes less than a prescribed minimum value AMIN. According to the invention, there may be differing contexts in which binary decisions may occur, each context having a corresponding estimated probability value which is up-dated with binary decisions in the respective context. Also according to the invention, there may be one or more possible next values for an estimated probability in response to a given binary decision event. The selection of one of multiple possible next values in response to a given binary decision event is preferably determined based on a renormalization correlation count.

26 Claims, 26 Drawing Sheets

OTHER PUBLICATIONS

J. Rissanen, G. Langdon, Jr.–Universal Modeling and Coding, IEEE, 1981.

D. R. Helman, G. G. Langdon, Jr., J. J. Rissanen–Arithmetic Compression Code Control Parameter Approximation,–IBM TDB, vol. 23, No. 11. 4/81.

G. G. Langdon, Jr.–Apparatus Supporting Half-Duplexed Encoding/Decoding Action,–IBM TDB, vol. 23, No. 11, 4/81.

G. G. Langdon, Jr., J. J. Rissanen, S. J. P. Todd and K. Y. Wong–Encryption Properties of Arithmetic Codes,–IBM TDB, vol. 23, No. 11, 4/81.

G. G. Langdon, Jr.–Tutorial On Arithmetic Coding,–(RJ3128), 5/6/81.

Christopher B. Jones,–An Efficient Coding System For Long Source Sequences, IEEE, 1981.

G. G. Langdon, Jr., J. J. Rissanen–Compression Of Black-White Images With Arithmetic Coding,–IEEE, vol. 29, No. 6, 1981.

G. G. Langdon, Jr., J. J. Rissanen,–Computational Speed Enhancement By Selective Precision In Arithmetic Code Operations–IBM TDB, vol. 24, No. 2, 7/81.

G. G. Langdon, Jr.–Constrained Channel Coding Using A Reduced Number of Arithmetic String Coding Steps Per Cycle–IBM TDB, vol. 24, No. 8, 1/82.

D. R. Helman, G. G. Langdon, Jr., N. Martin, S. J. P. Todd–Statistics Collection For Compression Coding With Randomizing Feature–IBM TDB, vol. 24, No. 10, 3/82.

G. G. Langdon, Jr., J. Rissanen,–An Adaptive File Compression Algorithm, RJ3460, 4/82.

G. G. Langdon, Jr., S. J. P. Todd,–General Unit-Time Arithmetic Codes For Constrained Channels, IBM TDB, vol. 25, No. 3A, 8/82.

G. G. Langdon, Jr., S. J. P. Todd,–Augend Computation For Arithmetic Channel Codes,–IBM TDB, vol. 25, No. 3A, 8/82.

G. G. Langdon, Jr., S. J. P. Todd,–Method For Application of ECC To Constrained Channels, IBM TDB, vol. 25, No. 3A, 8/82.

G. G. Langdon, Jr., J. Rissanen,–A Simple General Binary Source Code,–IEEE, vol. 28, No. 5, 1982.

G. N. N. Martin, G. G. Langdon, Jr., S. J. P. Todd,–Arithmetic Codes For Constrained Channels,–IBM Res. Develop., vol. 27, No. 2.

S. J. P. Todd, G. G. Langdon, Jr., G. N. Martin,–A General Fixed Rate Arithmetic Coding Method For Constrained Channels, IBM Res. Dev., vol. 27, No. 2.

G. G. Langdon, Jr.–A Note on the Ziv-Lempel Model For Compressing Individual Sequences,–IEEE, vol. 29, No. 2, Mar. 1983.

G. G. Langdon, P. H. Siegel, S. Todd–Constrained Channel Coding With Spectral Null, IBM TDB, 10/83.

G. G. Langdon, Jr.–An Introduction To Arithmetic Coding,–IBM Res. Dev., vol. 28, No. 2, 3/84.

S. Todd, G. G. Langdon, Jr., J. Rissanen,–Parameter Reduction and Context Selection For Compression of Gray-Scale Images, IBM Res. Dev., vol. 29, No. 2, 3/85.

Iseda, K., Saito, T.–An Adaptive Predictive Coding of Speech Using Arithmetic Code.,–Trans, Inst. Electron. & Commun. Eng. Jpn., vol. J68A, No. 11, 11/85.

Morita, H., Fujimoto, K., Kitada, S., Arimoto, S.–On Efficiency of Binary Arithmetic Codes.–TransInf. Process. Soc. Jpn., vol. 25, No. 4, 1984.

FIG.6 SAMPLE FINITE STATE MACHINE

| Qe | |
|---|---|
| .44 | $k_{m+1}^2$ ← $k_m^2$ |
| .43 | $k_{m+1}^1$ ← $k_m^1$ 01 11 → $k_m^4$ → $k_{m+1}^4$ |
| .42 | ↑ |
| .41 | $k_{m-1}$ |
| .40 | 00 10 → $k_m^3$ → $k_{m+1}^3$ |
| .39 | |

FIG.3

| CONTEXT | MPS | QE INDEX | QE VALUE |
|---|---|---|---|
| C0 | 0 | 0 | 0.5 |
| C1 | 1 | 12 | 0.10 |
| C2 | 0 | 29 | 0.001 |

FIG.4

C0 → 0 → MPS
C1 → 1 → MPS
C0 → 1 → LPS
C0 → 0 → MPS
C2 → 0 → MPS

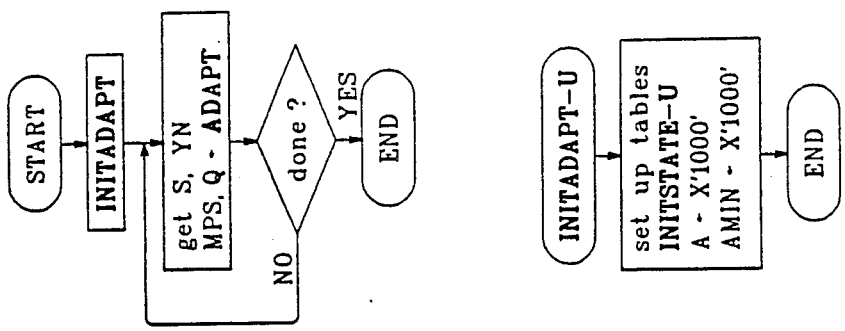
FIG.8
FIG.9
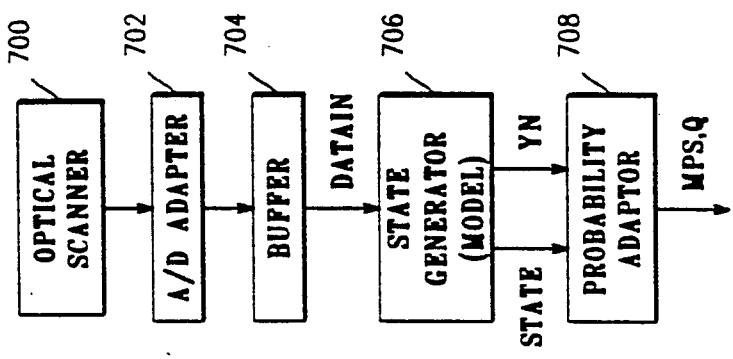
FIG.7

PROBABILITY ADAPTATION FOR ARITHMETIC CODERS

This application is a continuation of application Ser. No. 907,695 filed Sept. 15, 1986, now abandoned.

BACKGROUND OF THE INVENTION

A. Field of the Invention

The present invention involves the adapting of an estimated probability of a decision event as successive decisions are processed.

B. Description of the Problem

Various phenomena are represented as binary decisions in which one of two decision symbols (such as yes and no) is characterized by one probability (Pr) and the other symbol is characterized by a probability (1-Pr). The less likely symbol is typically referred to as the less probable symbol LPS whereas the other symbol is referred to as the more probable symbol MPS.

For example, in optical imaging, a frame of data may include a plurality of picture elements (or pels) which can be black or white. In a particular area of the frame, black pels may predominate. The probability of a white pel being in such an area is then the less probable event and the probability of a white pel being noted in the area may be characterized as Pr. Over time, the relative likelihood of black pels and white pels in the area may change, so that Pr and (1-Pr) may vary. In fact, over time white pels may become dominant in the area.

In various environments such as that outlined hereinabove, binary decisions are processed in some manner dependent on the probabilities Pr and (1-Pr) of the respective LPS and MPS decision outcomes.

In prior technology, the probability Pr is initially determined as an estimate from previous data or as an estimate based on intuition, mathematics, assumptions, a statistics collection, or the like. In some instances, the initial estimate may be used throughout the processing of decision data even though the original estimate may deviate considerably from the probability reflected in actual data.

In other instances, however, the estimated value for the probability is made to track the actual probability as reflected by actual data. In compressing and decompressing data based on binary arithmetic coding, for example, the estimate of the probability of an LPS event is notably important. In binary arithmetic coding, successive binary decisions are mapped into successively smaller, lesser-included probability intervals along a number line. In particular, for each binary decision an interval is partitioned into a P segment and a Q segment. The length of each segment is intended to correspond to the respective probability of the event or symbol corresponding to the segment. According to this type of coding, if there is an MPS event, the P segment becomes the new interval which is then partitioned into two segments for the next decision. Alternatively, if a less probable LPS event is encoded, the Q segment becomes the new interval which is then partitioned. A significant aspect of the compression achieved by arithmetic coding resides in the fact that the P segment is represented by fractional bits whereas the Q segment is represented by one or more bits. Because the MPS event is more likely to occur, a great majority of events are encoded with relatively few bits. To accurately allocate the portions of a number line interval and to ensure that the proper number of bits is allocated to each possible binary event, the respective probabilities should be reasonably accurate. Accordingly, adapting an estimated probability of the LPS event or MPS event as conditions change is particularly significant in arithmetic encoding.

In one approach to the problem of adapting the probabilities of an arithmetic coding device, a prior method has been suggested in which symbol probabilities are generated to reflect data history. One article which discusses such prior art is included in the IBM Technical Disclosure Bulletin in volume 22, No. 7, December 1979, pp. 2880–2882, and is entitled "Method for Converting Counts to Coding Parameters" (by G. G. Langdon, Jr. and J. J. Rissanen). The article states that it is desired to detect changes in the symbol probabilities from observed symbol occurrences, and to modify the LPS probability q accordingly. One approach suggested by the article is to change q to reflect the number of counts of one symbol divided by the total number of symbols counted during a symbol string. That is, if k is the counts for one symbol and n is the number of counts for both symbols, symbol probability is changed based on k/n.

Another article by Langdon and Rissanen, "Compression of Black-White Images with Arithmetic Coding", IEEE Transactions on Communications, volume COM-29, No. 6, pp. 858–867, June 1981, also discusses adapting probabilities in an arithmetic coding environment. In discussing adaptation to nonstationary statistics, the IEEE article proceeds on page 865 as follows: "Suppose that we have received r [consecutive] 0's at state z, and our current estimate of the probability of [symbol] s(i) being 0 is $p=c0/c$ [where c0 is a count defined as $c(0|z,s(0) \ldots s(t))$ and c is a count defined as $c(z,s(0) \ldots s(t))$]. We receive the symbol s(i). If s(i) is 0, we test: Is $p'(r+1) \leq 0.2$? If yes, we regard the observation as being . . . consistent with our estimate of p, and we update c0 and c by 1 to form a new estimate. . . . If, however, $p'(r+1) < 0.2$, the observation is likely an indication of changed statistics, and we ought to be prepared to change our estimates to a larger value of p. We do this by halving the counts c0 and c before updating them by 1. If the received, symbol s(i) is 1, we do the same confidence test using the probability p(r) . . . . In reality, for the sake of easier implementation, we put suitable upper and lower bounds on the count of the less probable symbol for each skew value Q [Q(s)] to indicate when to halve or not the counts." In describing the Q(s) value, it is noted that the IEEE article discusses the approximating of the less probable symbol probability to the nearest value of $2^{-Q(s)}$ where Q(s) is an integer referred to as the "skew number".

A further discussion of probability adaptation in an arithmetic coding skew coder is set forth in an article by G. G. Langdon, Jr. entitled "An Introduction to Arithmetic Coding", *IBM Journal of Research and Development*, vol. 28, n. 2, March 1984, 135–149.

As noted hereinabove, the skew coder is limited to probability values which are powers of 2 (for example, $\frac{1}{2}, \frac{1}{4}, \frac{1}{8}, \ldots$). Although the skew coder can provide rapid adaptation, the limitation on possible probability values to powers of 2 results in inefficiency when the probability is at or near 0.5.

Other prior technology includes U.S. Pat. Nos. 4,467,317, 4,286,256, and 4325085 and an IBM Technical Disclosure Bulletin article in volume 23, No. 11, April 1981, pp. 5112–5114, entitled "Arithmetic Compression Code Control Parameters Approximation" (by D. R. Helman, G. G. Langdon, Jr., and J. J. Rissanen). The cited references are incorporated herein by reference to provide background information.

SUMMARY OF THE INVENTION

The present invention addresses the problem of providing a computationally simple yet nearly optimum technique for adaptively determining symbol probabilities, especially in a binary arithmetic coding environment.

One sample environment of the invention is in binary arithmetic coding. In binary arithmetic coding, a number interval shrinks to successively smaller dimensions after each decision in a sequence of decisions is encoded. How much a current interval shrinks in response to an encoded decision event depends on the outcome of the decision, the size of the resulting interval being relatively large for more probable outcomes and relatively small for less probable outcomes. Each resulting interval is represented as an augend value A. If the augend value A is less than a prescribed minimum value AMIN, the augend value A is renormalized to exceed AMIN.

In other environments as well an augend value may be defined which is renormalized in response to decision event inputs.

In accordance with one preferred mode of the present invention, there is a table of probability values associated with one of the two possible binary events that can result from a decision. At a given time and for a given context in which decisions are made, one table value is identified as the current probability value. According to the invention, a renormalization of the augend A in response to the encoding of a decision event prompts an up-dating of the current probability value. That is, providing the table has sufficient entries, a pointer moves to a higher probability value in response to a renormalization caused by a first type of decision event and moves to a lower probability value caused by the other type of binary decision event.

It is thus an object of the invention to provide for updating the probability value of a decision event based on augend renormalization.

In a particular embodiment of the invention, decisions may be associated with differing contexts. For example, blackwhite binary picture element (pel) decisions may be applied to differing contexts —a first context perhaps applying to a neighborhood of pels having much more black pels than white pels, a second context applying to a predominantly white pel area, and a third context in which the pels may be fairly evenly distributed. The present invention permits the processing of decisions in such multiple contexts, wherein for each context there is a respective table value identified therefor.

It is thus another object of the invention to adapt the probability value for each respective context in response to the encoding of decision events in the respective context.

Moreover, in one multiple context embodiment, it is a related object to adapt the probability values for differing contexts based on the renormalization of a common augend value. In another multiple context embodiment, each context has a respective augend value associated therewith.

Also according to the invention, the "rate" at which adaptation occurs may be varied. In a first single rate embodiment, the present invention permits a current value to be (a) incremented to one prescribed higher value in the table in response to renormalization following a first type of binary decision input and (b) decremented to one prescribed lower value in the table in response to renormalization following the other type of binary decision input. For example, in the event of an LPS renormalization, the estimated probability value $Q_e$ of the LPS event increments to the next prescribed higher value in the table whereas in the event of an MPS renormalization, the estimated probability for $Q_e$ decrements to the next lower value in the table. In an alternative, multiple rate embodiment, any of a plurality of probability values can succeed a current value. In particular, when there is a high renormalization correlation (i.e., numerous successive LPS renormalizations, MPS renormalizations, or both), larger changes in the probability value are provided.

It is thus another object of the invention to permit the probability value to index through the table over varying distances depending on the instability recognized through renormalization correlation, in order to move more rapidly to correct for assumed gross errors in estimation.

In accordance with one embodiment of the invention, the paths that can be followed from probability value to probability value in the table are specified in accordance with a finite state machine implementation. That is, a plurality of states are provided, one of which is the current state for a given time. The current state indicates not only what the present probability value is but also reflects a history of prior renormalizations in the possible next states linked thereto.

In another embodiment, selection of the next probability value from among the possible succeeding values is determined logically. Based on a count indicative of renormalization correlation, the current probability value is up-dated to a next value which may be more than the next higher or lower value in the table.

For an ordered table, the present invention thus achieves the object of permitting indexing by various prescribed increments along the table depending on renormalization correlation.

It is yet a further object of the invention to choose entries in the probability value table to balance increment and decrement probabilities at each probability value.

Moreover, in choosing values for the table, it is an additional object of the invention to avoid probability values which are too close to the minimal augend value. Such values would too readily prompt MPS renormalization.

Finally, the present invention provides good adaptation over the range of possible probability values and permits a convenient method of probability adaptation without event counters being required.

BRIEF DESCRIPTION OF THE DRAWINGS

FIG. 3 is a table showing current information stored for differing decision contexts.

FIG. 4 is an illustration showing a sequence of decision inputs in various contexts.

FIG. 6 is an illustration of a finite state machine implementation of the invention featuring multi-rate updating of the probability value.

FIG. 7 is a diagram showing the present invention in an arithmetic coding environment.

FIG. 8 through FIG. 35 are flowcharts depicting an implementation of the present invention in an arithmetic coding environment.

DESCRIPTION OF THE INVENTION

I. An Arithmetic Coding Embodiment

Figure 1:
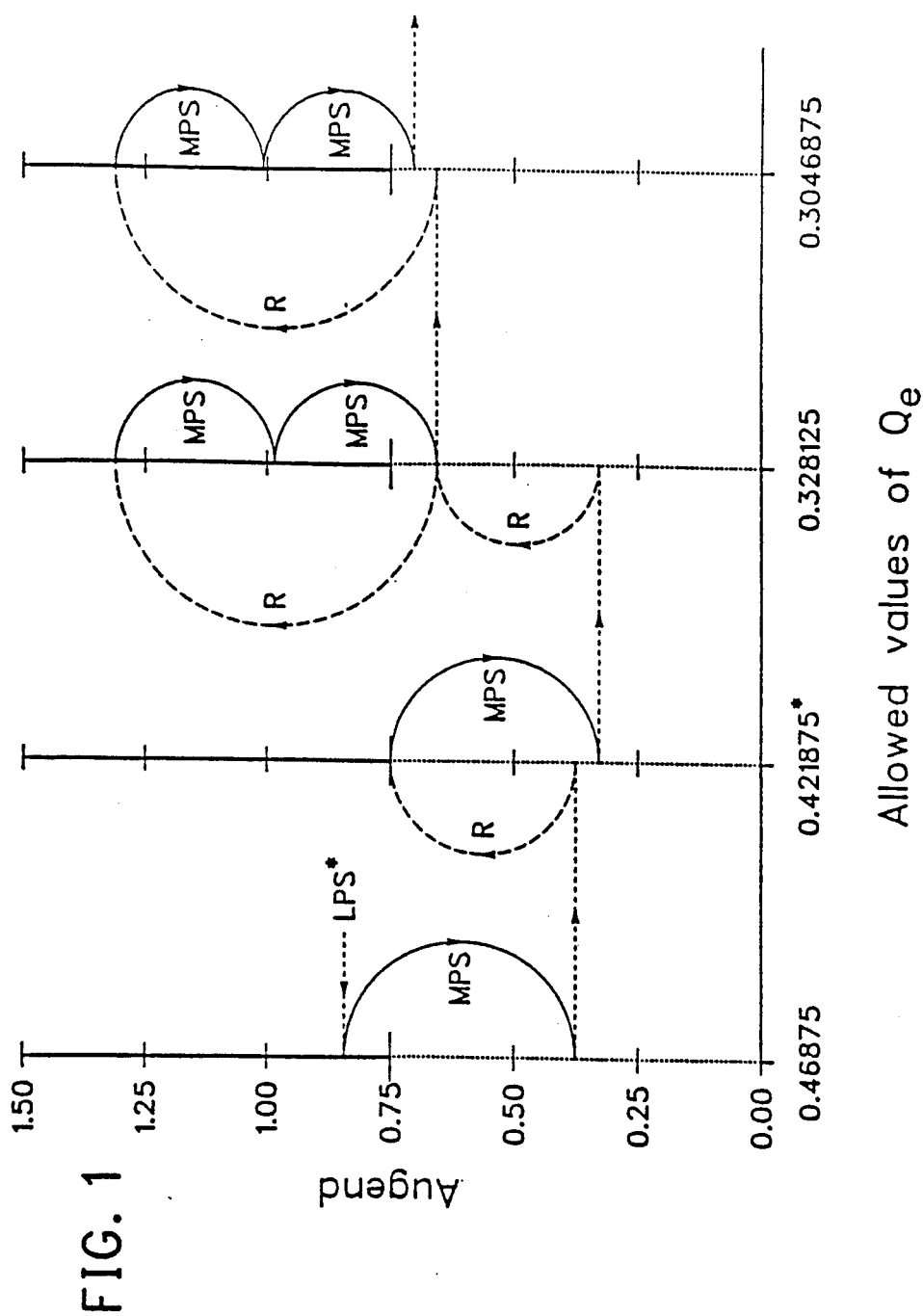
FIG. 1 is an illustration showing the changing of the estimated probability value $Q_e$ in response to augend renormalization.

A. Arithmetic Coding and Probability Adaptation Environment

The above-cited prior art articles by Langdon and by Langdon and Rissanen discuss arithmetic coding in detail and are incorporated herein by reference for such teachings.

Arithmetic coding has been found to be a powerful technique for encoding strings of data symbols into compressed form, transferring the compressed (encoded) data, and retrieving the original data symbol string by means of a decoder which undoes the encoding. Arithmetic coding derives its power from two basic attributes: (1) the ability to approach the entropy limit in coding efficiency and (2) the ability to dynamically change the probabilities of the symbols being encoded.

In accordance with arithmetic coding, a plurality of decisions are to be encoded to represent a point on a number line. The point is associated with a number line interval which uniquely represents a particular sequence of decisions. Such encoding is accomplished by initially defining a current interval bounded by two points on a number line. The current interval is then partitioned into segments, each segment corresponding to one of the possible events that may result from a decision. The possible events should be exclusive; no segments overlap. In a multiple symbol environment, each decision can result in one of m events (where $2 \leq m$). The length of each segment is determined by the relative probability of the decision event corresponding thereto. That is, the larger the decision event probability, the larger the segment corresponding thereto. This is significant, in that larger segments can be represented by fewer bits; hence, the events which should be encoded more frequently are represented by relatively few bits.

For binary arithmetic coding in which m=2, a less probable symbol LPS event may correspond to either a YES or a NO symbol (or event) for a given YES/NO (Y/N) decision; the other event then corresponding to a more probable symbol MPS event. The segments are conveniently referred to as the Q segment (which corresponds to the less probable event) and the P segment (which corresponds to the more probable event). The length of the Q segment corresponds to the estimated probability $Q_e$ for the LPS event and the P segment corresponds to the probability $(1\ Q_e)$. If the Q segment is at the lower-in-value end of the number line, the coding scheme is styled a P/Q scheme. However, as noted in the co-pending U.S. patent application Ser. No. 06/907,700 filed on even date herewith, entitled "Arithmetic Coding Data Compression/De-compression By Selectively Employed, Diverse Arithmetic Encoders and Decoders," invented by J. L. Mitchell and W. B. Pennebaker, the ordering of the segments may be varied. The above-referenced application is incorporated herein by reference for the discussion of various arithmetic coding embodiments with which the present invention may be employed.

Referring to the P/Q binary arithmetic coding scheme by way of example, a code point C is specified to point at the bottom of a current interval. Depending on whether the next event is an LPS or MPS event, the Q segment or P segment, respectively, is selected as the current interval which is then divided into a Q segment and P segment, and so on. The current interval continues to shrink with each decision, and the point C identifying successive current intervals increases in precision.

The value of the current interval is represented as an augend value A. To facilitate computation, the augend value is maintained within prescribed limits. For example, A can be held between 0.5 and 1, or between 0.75 and 1.5, or between 1.0 and 2.0. The advantages achieved by these choices are noted herein and in a co-pending, U.S. patent application Ser. No. 06/907,714 filed on even date herewith, invented by researchers at the IBM corporation and entitled: Arithmetic Coding Encoder and Decoder System. At this point it should be noted that, traditionally, probability intervals range between 0 and 1. Although having a probability interval bound which exceeds unity may appear improper, prescribing such a limit results in no adverse consequences and in fact facilitates coding because of renormalization.

When the augend value A falls below the lower limit AMIN, the augend value is renormalized. In particular, the renormalization involves multiplying the augend value by two (or some power of two) to bring the value of A to above AMIN. As noted hereinbelow, the value for A is typically involved in various multiply operations. During encoding with properly prescribed limits, these operations can be greatly simplified. In this regard, it is observed that the coding process for the typical P/Q binary coding scheme may be summarized as follows:

If an MPS is encoded
$$C' \leftarrow C + A \times Q_e$$
$$A' \leftarrow A(1 - Q_e)$$

If an LPS is encoded
$$A'' \leftarrow A \times Q_e$$

wherein ← is the assignment notation used in programming languages such as APL.

By maintaining A within the limits 0.75 to 1.5, the value of A may be approximated as 1.0. It is then noted that the above computations simplify to:

If an MPS is encoded
$$C' \leftarrow C + Q_e$$
$$A' \leftarrow A - Q_e$$

If an LPS is encoded
$$A'' \leftarrow Q_e$$

In the event that the augend value A (i.e., the changed values A' or A") A<0.75 after a decision event is encoded, there is a renormalization of A and C. By renormalizing C as well as A, the code point value remains in the same proportions as the interval. Hence, the renormalization allows finite precision arithmetic and does not adversely affect the coding process precision.

In accordance with the present invention, the value of $Q_e$ is up-dated each time A and C are renormalized.

For decoding the encoded data generated according to the P/Q scheme, the following operations are performed:

if $C \geq Q_e$ an MPS is decoded and the following computations are made:
$$C' \leftarrow C - Q_e$$

$$A' \leftarrow A - Q_e$$

If the above condition does not hold, an LPS is decoded and
$$A'' \leftarrow Q_e$$

The simplified encoder (and decoder) described above are ideal for hardware implementation because the range subtraction (addition) and the code stream addition (subtraction) can be done in parallel. However, a software implementation employing the same conventions for defining and changing the code stream is not as efficient because two arithmetic operations are required on the most frequently taken path. Therefore, a more efficient software implementation of the encoder is realized by pointing the code stream, C, at the top of the current interval rather than the bottom. For software, the encoding process is as follows: If there is an MPS even
$$A' \leftarrow A - Q_e$$
If there is an LPS event
$$C'' \leftarrow C - (A - Q_e)$$

$$A'' \leftarrow Q_e$$

In either case, if A < 0.75 renormalize A' or A'' and C'; update $Q_e$.

A description of inverted coding is set forth in the aforementioned U.S. patent application Ser. No. 06/907,700 relating to arithmetic encoding with selectively employed encoders and decoders.

In examining the above conventions, it is noted that A and C are renormalized in each embodiment when A < 0.75, and $Q_e$ is correspondingly up-dated.

The manner in which $Q_e$ is up-dated according to the invention is now described.

B. Up-dating the Probability Estimator

1. Up-dating $Q_e$ with Each Augent Renormalization

FIG. 1 illustrates the up-dating of an estimated probability value $Q_e$ as succeeding events are decoded and renormalizations occur. In FIG. 1, the ordinate represents values of the augend A and the abscissa represents allowed values of $Q_e$ as included in a $Q_e$ table (discussed hereinbelow). Starting at the allowed $Q_e$ value of 0.421875, an LPS event is encoded resulting in an augend value of 0.421875. The LPS event which drives the augend to a value less than 0.75, results in an LPS renormalization (or "LPS renorm") which results in an incrementing of the $Q_e$ value to 0.46875 and a renormalization of A to a value of 0.84375. It is noted that renormalizing A and C in the present embodiment involves a multiplication by two. This operation is not only simple —being performed with simply a register shift—but also makes it easy to keep count of the number of renormalizations performed. A subsequent MPS event results in A taking on the value 0.375 according to the simplified expression:
$$A' \leftarrow A - Q_e$$

That is,
$$A' = (0.84375 - 0.46875) = 0.375$$

Because A is less than 0.75, an MPS renormalization (or "MPS renorm") takes place. $Q_e$ takes on the lower value of 0.421875 and A is renormalized to a value of 0.75. (A further renormalization is not required because the value of A is no longer less than 0.75.) On the next MPS event, A decreases to 0.328125 which is less than 0.75. A lower $Q_e$ value is chosen at 0.328125. The value of A is doubled to equal 0.65625 which is still less than 0.75. The value of A is doubled again so that A becomes 1.3125. A subsequent MPS event reduces the augend to 0.984375 which exceeds 0.75 so that no renormalization occurs. Another MPS event causes A to drop to 0.65625 which results in an MPS renorm. A lower value of $Q_e$ is chosen, namely 0.3046875, and the augend A is multiplied by two to become 1.3125. On the second MPS event thereafter, an MPS renorm is required.

2. The $Q_e$ Table(s)

In accordance with the invention, $Q_e$ values such as those shown in FIG. 1 are stored in table form. In Table 1, a plurality of allowed $Q_e$ values are shown in hexadecimal notation in the left column. Each $Q_e$ value in the table is preferably a 12-bit value and is defined to occupy two bytes. The $Q_e$ values are divided by 5461 (hexadecimal 1555) to convert to N-decimal fractional representation. A 5 bit index is sufficient to uniquely identify the $Q_e$ value. To move to an adjacent entry in the table, a shift of two bytes is required. In Table 1, the second column indicates how many bytes are to be shifted for each listed probability value following an LPS renorm. It is observed that, in some instances, an LPS renorm results in the probability value incrementing by one, two, or three index positions in the table.

In examining Table 1, it is observed that entries therein correspond to the $Q_e$ values set forth in FIG. 1. That is, 0.46875 in decimal corresponds to the 0a80 hexadecimal value in Table 1. The three entries listed thereafter —namely 0a00, 0900 and 0700— correspond respectively to the 0.421875, 0.328125, and 0.3046875 values of FIG. 1. The negative of $Q_e$ is used where MPS is 1.

An alternative to Table 1 is shown in Table 2. Table 2 shows qi0 values for allowed $Q_e$ values which are associated with LPS renormalization. The qi0 term in Table 2 is referred to as qilps(i0) indicating that the index contains information relating to the next $Q_e$ value (q0) for both MPS of 0, i.e., positive $Q_e$, and MPS of 1, i.e., negative $Q_e$, and the index (i0) therefor which apply when an LPS renorm occurs. In Table 2, both the next $Q_e$ value and its associated i0 value are found at the previous index. In Table 1, however, a next index is first determined and then the next $Q_e$ value is determined therefrom. Table 2 provides a simpler look-up procedure.

Table 3 is similar to Table 2, except that it is intended for use with MPS renorms. In particular, in the event of an MPS renorm, Table 3 shows the next probability value q0 and next index i0 for each $Q_e$ value in the table. In Table 2, higher values are chosen whereas in Table 3 lower values are chosen. Note that the index changes in multiples of 4 for tables 2 and 3 because qi0 has both the new Q0 and I0 at an entry.

It should be recognized that the tables only include $Q_e$ values in the range from 0 to 0.5. At 0.5, the binary event representing the LPS becomes the MPS and vice versa. The event which corresponds to $Q_e$ thus changes. For example, if a white pel event represents an LPS event, $Q_e$ values represent the probability estimated for the white pel event; however, when the $Q_e$ value reaches and exceeds 0.5, the black pel event now becomes the LPS event identified by $Q_e$. The $Q_e$ table may be viewed as symmetric about the exchange point where the definitions of the LPS and MPS change.

The selection of allowed $Q_e$ values is determined based on a number of factors. First, certain values are recognized as "bad" values. In particular, those values which can result in "trapping" the $Q_e$ value are not permitted. Probability values that are at or near the values AMIN/2, AMIN/4, ...

$$\frac{AMIN}{2^n}$$

—where n is some positive integer— are considered "bad" values. At such values, a cycle of (1) LPS renormalization, (2) movement to a first $Q_e$ value, (3) MPS renorm after a single likely MPS, with a corresponding movement to a second (lower) $Q_e$ value, (4) another LPS and LPS renorm, and (5) a return to the first $Q_e$ value could trap the estimation process. Accordingly, the values of $Q_e$ are preferably selected to exceed $$\frac{AMIN}{2^n}$$

by a prescribed value $\delta$, so that the probability of an MPS renorm after an LPS renorm is not excessively high. One method of accomplishing this end is to space all smaller $Q_e$ values after renormalization far enough away from hexadecimal value '1000' to require a plurality of MPS events to invoke an MPS renorm following an LPS renorm. For $Q_e$ values near 0.5 this condition is relaxed. For very small $Q_e$ the interval between the renormalized $Q_e$ and AMIN must be large enough that the MPS renorm probability is of the same order of magnitude as the LPS probability.

Figure 2:
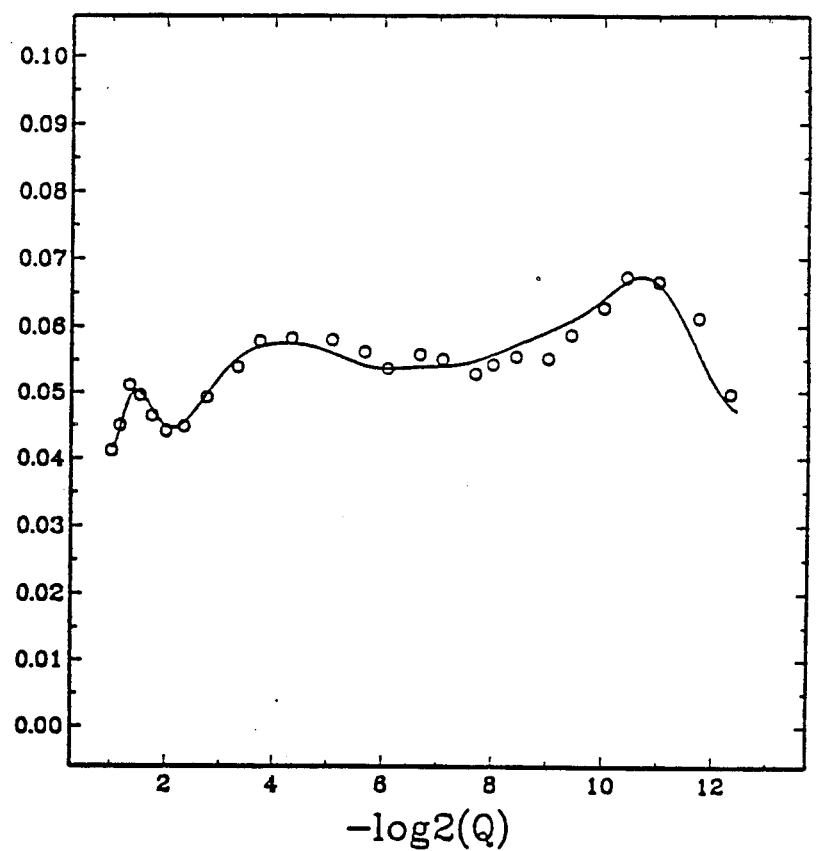
FIG. 2 is a graph showing coding inefficiency.

A second consideration in selecting table values involves coding inefficiency. In this regard, it is desirable that minimum coding inefficiency be achieved over the range of allowed $Q_e$ values. Referring to FIG. 2, a graph of coding in-efficiency vs. the magnitude of the $\log_2 Q$, for the $Q_e$ values included in Table 1. The circles represent experimental results and the solid line represents theoretical results for a single context coding embodiment (see section 3). Coding inefficiency is calculated from the difference between the number of renormalization shifts per symbol and the entropy. Preferably, but not necessarily, the most uniform curve —given table granularity and arithmetic approximations used in the coding— is desired.

Third, system responsiveness is a consideration; namely, how long it takes to reach the proper $Q_e$ value from a value far from the mark. In furtherance of this end, larger increments and decrements are selected between adjacent $Q_e$ values, provided that such large differentials do not adversely impact stationary results. Stationary results are generated based on data provided according to a fixed probability —for example, by a pseudorandom number generator producing outputs based on a fixed probability. Nonstationary results are based on actual data wherein the probability may fluctuate over time.

Table 1 was determined in accordance with the above considerations and represents a compromise between simplicity, minimum storage requirements for each context (e.g., six bits which include one bit for the sense of the MPS symbol and five bits for the index to the $Q_e$ value), reasonable coding efficiency for fixed (i.e., stationary) statistics, and good performance on multiple context data obtained from different data compression models (for example, a facsimile compression model and a continuous tone image compression model).

In the above description, a compromise between coding efficiency and rapid estimation of changing probabilities is noted. In furtherance of these two objectives, the present invention further suggests an alternative methodology for increasing the correction rate. Using the same number of bits for each table entry (e.g., six bits), any one of a plurality of next possible succeeding values may be chosen as the next probability value based on a renormalization correlation count. This multiple rate embodiment is described hereinbelow in section 4.

3. Single Context and Multiple Context Adaptation

Referring to FIG. 3, a context table is shown. In particular, three contexts C0, C1, and C2 are listed. Each context corresponds to a different setting in which decisions are being made. For example, the differing contexts could represent different areas in a frame of optical data. One area of the frame may be predominately black, another may be predominately white, and a third area may be fairly evenly represented by each type of event. Accordingly, for each context, there is a respective MPS identifier; that is, an indicator as to whether the black (or YES) decision is the MPS or whether the white (or NO) decision is the MPS. In binary notation this is represented in the FIG. 3 table by the MPS column in which the 0 event represents the MPS event for the C0 and C2 contexts, while the 1 event represents the MPS event for the C1 context.

The next column in the table is a $Q_e$ index table which indicates the $Q_e$ entry currently being pointed to for the respective context. In context C0, the 0th entry is being pointed to; in the C1 context, the 12th entry is being pointed to; and in the C2 context the 29th entry is being pointed to. The respective current $Q_e$ values are shown in the last column to be 0.5, 0 10, and 0.001, respectively. The MPS identifier and $Q_e$ index are preferably represented by 6 bits, the $Q_e$ index preferably being represented by 5 bits in this embodiment —it being recognized that the number of bits may vary.

In accordance with one embodiment of the invention, a single augend value is stored and used regardless of which context is being considered. As decisions are entered in each context and as renormalizations are provided for each context, a common augend is processed.

By way of example, a string of 0 and 1 bits are shown, each being associated with a corresponding context. The string 01100 represents bits in the C0-C1-C0-C0-C2 contexts, respectively. From the table of FIG. 3, it is observed that the bit sequence represents an MPS (for C0), an MPS (for C1), an LPS (for C0), an MPS (for C0), and an MPS (for C2). Let the initial value of A before the first bit is encoded be 1.0 for purposes of this example. In response to the bit string 01100, then, the following operations take place given a P/Q encoding scheme as described hereinabove:

i. For the first bit, $$A' \leftarrow A - Q_e(C0) = 1.0 - 0.5 = 0.5$$

Because A is now less than 0.75, A' is renormalized to 1.0 and the value $Q_e(C0)$ is decremented to 0.48.

ii. The second bit represents an MPS in context C1, causing the value of the augend A to drop according to the expression $A' \leftarrow A - Q_e(C1)$ which is equal to $(1.0-0.1) = 0.90$. Neither renormalization nor $Q_e$ up-dating is performed.

iii. The third bit is an LPS in context C0, resulting in an LPS renorm. The augend value changes from 0.90 to $Q_e(C0)$, or 0.48. The value for A must be renormalized (doubled) to the value of 0.96 and the $Q_e$ value for the C0 context is incremented. For this example, it is assumed that the value $Q_e(C0)$ increments by one entry back to the 0th entry. As discussed hereinbelow, the invention also contemplates the $Q_e$ value being moved upward to a single value which is more than one entry away. Alternatively, the invention contemplates the possibility of moving the $Q_e$ value upward to a chosen one of several possible next $Q_e$ values depending on how far the $Q_e$ value appears to be from the actual probability. The latter methodology is discussed hereinbelow as a multiple rate embodiment.

iv. At the fourth bit, there is an MPS for context C0. A is altered to $(0.96-0.5)=0.46$ which requires an MPS renorm. The value for A is doubled to 0.92 and $Q_e(C0)$ drops to 0.48.

v. The fifth bit corresponds to an MPS in context C2. The value of the augend A becomes $(0.92-Q_e(C2))=0.92-0.001=0.919$ which is greater than 0.75. No renormalization takes place.

After the five bits, the table has the following entries. For context C0, MPS=0, the $Q_e(C0)$ index is 1, and the $Q_e(C0)$ value is 0.48. For context C1, all data remains unchanged. For context C2, all data remains unchanged. The current augend A for the next encoded decision event is 0.919 regardless of the context of the decision.

Another multiple context embodiment is also within the scope of the invention. In particular, each of a plurality of contexts has a respective augend value which is up-dated and renormalized only for decisions in the context thereof. In environments where additional precision is desired for the estimator, an independent augend for each context increases the storage per context to include the augend bits.

The multiple context embodiment, compared to a single context embodiment, permits a plurality of decision contexts to be processed together.

4. Single Rate and Multiple Rate

A single rate estimator provides that, for a given $Q_e$ value, there is only one specified greater value which is to be chosen as the next probability for an LPS renorm and one specified lesser value to be chosen for an MPS renorm. An embodiment of a single rate estimator is set forth hereinbelow in section 5 as a finite state machine.

In addition to the single rate estimator, a multiple rate estimator is also contemplated by the present invention. In particular, any one of a plurality of possible permitted next $Q_e$ values can be chosen after a renorm depending on renormalization correlation. Renormalization correlation indicates the stability (or instability) of the statistics of the data set for each context individually. This is done by remembering the last renormalization (either from an LPS or due to an MPS), and incrementing a four bit counter by one if the renormalization is the same and decrementing the counter by two if it is different. The counter is clamped to prevent it from going negative or exceeding 15. The amount of change in the estimate $Q_e$ is determined by the value of the counter, the change being larger as the counter value increases. The counter is also locked at the smallest allowed value of $Q_e$. This counter, a flag bit whose state is determined by the previous renormalization for the context, and the variable increment/decrement structure provide the multi-rate estimation process.

The renormalization correlation measure requires an additional five bits of storage for each context. It also uses a table of estimated $Q_e$ values with about twice the number of entries as the 6 bit context version. Thus, a total of twelve bits of storage per context is required for this version: six bits for the value of $Q_e$, one for for the MPS sense, one bit for the sense of the last renorm, and four bits for the correlation count. Table 4 lists the $Q_e$ values used for the multi-rate estimator. The 61 entries require at least a 6 bit index. The LPS decrement is listed in the second column in units of 2 bytes.

5. Finite State Machine Representation of the $Q_e$ Table

Figure 5:
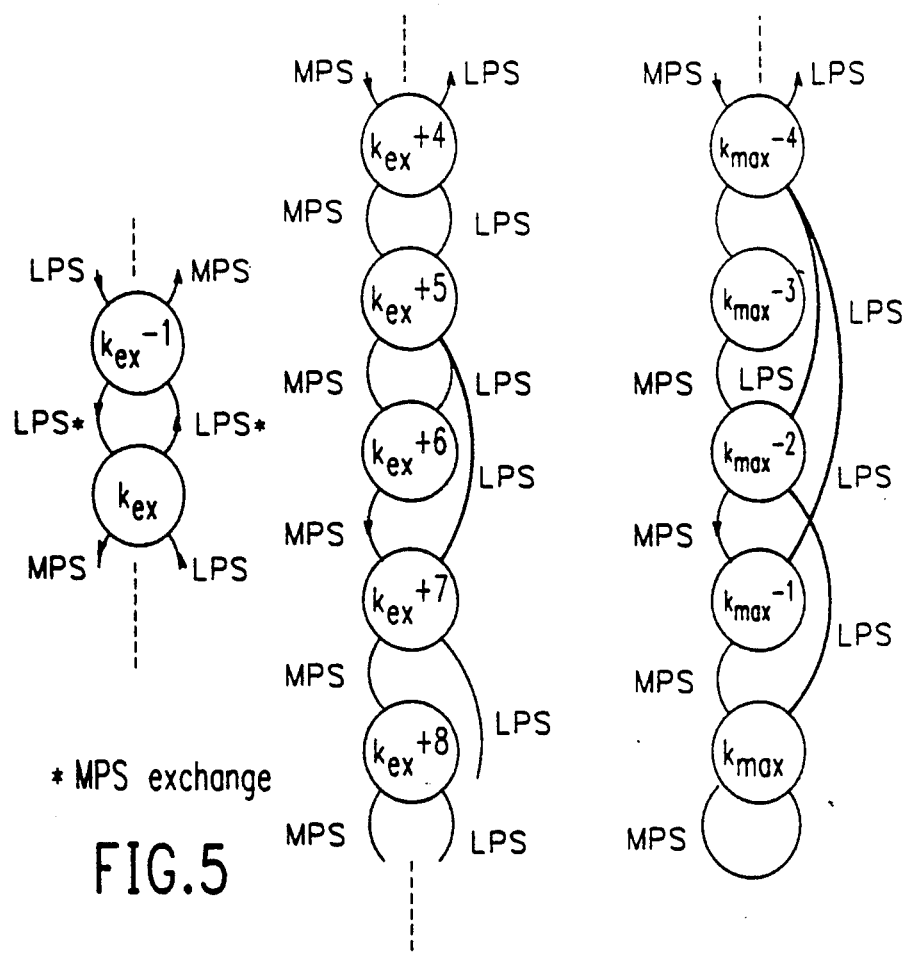
FIG. 5 is an illustration of a finite state machine embodiment of the invention which features single-rate probability updating.

FIG. 5 shows a finite state machine implementation of a single rate, single context estimator. The value $k_{ex}$ represents a state at which an event which MPS and LPS event definitions are exchanged. In FIG. 5, each state has one outgoing path for an MPS renorm and one outgoing path for an LPS renorm. For $k_{max}$ the MPS renorm results in an up-dating which returns to the same state.

Each state may thought of as a table entry, representing a particular $Q_e$ value. Each entry is linked to two possible succeeding entries. Preferably, MPS renorms result in movement to the next state closer to $k_{max}$. On an LPS renorm, it is noted that the state may change by one, two, or more state position on its path to a single possible next state.

In FIG. 6, a sample multiple rate finite state machine implementation is illustrated. For a given value of $Q_e$, e.g., 0.42, there are a plurality of states $(k_m)^1$ and $(k_m)^2$ which can follow state $k_{m-1}$. Also deriving from state $k_{m-1}$ are two other possible states: $(k_m)^3$ and $(k_m)^4$. Each follows a unique path from state $k_{m-1}$, each path being identified by two bits. One bit indicates whether the present renorm is an LPS or an MPS renorm and the other bit indicates whether the most recent previous renorm correlates to the current type of renorm. "00" indicates, for example, that the present renorm is an LPS renorm and that the renorm previous thereto was not an LPS. The "01" indicates that the current renorm is an LPS and that there is correlation. In the simplified sample finite state machine, the 00 path goes to the adjacent higher value, 0.43 in the sample. (The values for $Q_e$ have been selected to simplify the explanation and do not represent probability values taken from an actual table.) For the 01 path, however, the next value is two entries up —namely 0.44— reflecting the earlier correlation. For the two MPS renorm states, the same $Q_e$ value results. However, if appropriate, the two MPS paths may result in different $Q_e$ values sometime thereafter. In the finite state machine, the renormalization count is integrated into the plurality of paths.

C. Flowchart Implementations

Referring to FIG. 7, the basic structure of the adaptor or probability adaptor system is shown in a specific image processing embodiment. An optical scanner 700 receives reflectance or photon count information from a item being scanned. The information in analog form is converted to digital data by an A/D converter 702 which directs the data in to an image buffer 704. The image buffer conveys data stored therein to a state generator (model) 706.

The state generator 706 uses input data DATAIN to determine the context STATE and current symbol YN (yes/no). The sense of the most probable symbol (MPS) and the least probable symbol (LPS) probability $Q_e$ which are stored at that context are generated as outputs by the probability adaptor for use externally. If a decision results in renormalization and an up-dating of $Q_e$, the output values from the probability adaptor 708 correspond to values stored prior to such renormalization and up-dating.

FIG. 8 is a flowchart showing the general operation of the probability adaptor 708.

Figure 13:
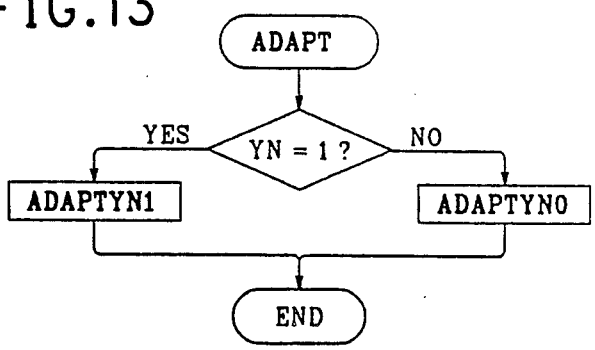

The operation INITADAPT (FIG. 9 and FIG. 10) initializes the system and context storage. The model process is represented by the statement "get S,YN". The ADAPT block (FIG. 13) uses the state S to immediately look up the MPS and Q values for that state and then adapts MPS and Q according to the YN value. The decision as to when to stop is provided by some external means.

For purposes of explanation, the following definitions of terms used in the various flowchart operations discussed hereinbelow are provided.

Q is defined as a fixed point fraction with 12 significant bits in the programs and flow charts.

A is a 16 bit integer, but can be considered a binary fraction with the binary point positioned to provide 12 fractional bits and 4 integer bits. A can be treated either as a universal parameter (in flow chart names followed by the suffix -U) or as a function of context (suffix -C). In the latter case, for example, each context may keep an independent value of A, A0(S)).

Q0(S) represents the LPS estimated probability for context STATE S. (It is noted that the context STATE relates to different backgrounds of decisions which may be processed at the same time, each having its own respective estimated Q value and its own definition of MPS and LPS events. This context STATE differs from the $k_x$ states discussed with regard to the finite state machine, wherein each state corresponded to a particular $Q_e$ value.) Q0 is positive when MPS is zero. When MPS is one, Q0 is the negative of the LPS estimated probability.

I0(S) is an indicator of the current estimated LPS probability in the table. I0 can have two parts. The low order byte I0B is always the index of the current estimated LPS probability in the NEWQ0 table. An example of a NEWQ0 table can be created from the first halfword column in Table 1 for a 5 bit $Q_e$ The high order byte R0B is the current rate parameter for the multi-rate implementation (suffix -M). For the single rate implementation (suffix -S) R0B is always 0 which means that I0(S) is equal to I0B(S). For the multi-rate implementation the low order four bits of R0B contain the four bit counter measuring renormalization correlation. The next bit is a flag which is set to 1 when the renormalization is on the MPS path, and reset to 0 when the renormalization occurs on the LPS path.

RMPS is the table used to up-date the rate for the multi-rate system after an MPS renormalization. The index to RMPS is 5 bits. The most significant bit is one if the previous renormalization for the context was an MPS renorm and zero if the previous renorm for the context was an LPS renorm. The low order 4 bits of the input contains the current correlation count. The output has the same structure, with the most significant bit being set to indicate that this renormalization is an MPS renormalization, and the low order 4 bits containing the new correlation count. The correlation count in the output is incremented by one relative to the input (to a maximum of 15) if the renormalization flag of the input is set, and decremented by 2 (to a minimum of zero) when the renormalization is not set.

RLPS is the table used to up-date the multi-rate system after an LPS renormalization. The table structure is similar to RMPS, except that the correlation count is incremented by one (to a maximum of 15) if the input renormalization flag bit is zero, and decremented by 2 (to a minimum of zero) if the flag bit is one.

IMPS is the table used to up-date the index I0 after an MPS. The previous I0 is the index to this table and the output of the table is the new I0. The low order byte of I0 (I0B) is the index to the new $Q_e$. One possible table of allowed $Q_e$ values for this multi rate system is given in the first column of Table 4. The high order byte contains the new R0B rate byte. When R0B is zero, the MPS renormalization moves the $Q_e$ index by 2 to the next smaller entry.

When R0B is not zero, extra change is added or subtracted from the $Q_e$ index. In the case of the MPS renorm, a single increment by two is always used, and therefore is combined with the extra increments to simplify the computations. INC is the table referenced by the rate to determine the total amount added to the I0B index into the NEWQ0 table. One possible table has entries of

| | | | | | | | | | | | | | | | |
|---|---|---|---|---|---|---|---|---|---|---|---|---|---|---|---|
| 2 | 2 | 2 | 4 | 4 | 4 | 6 | 6 | 8 | 8 | 10 | 12 | 12 | 12 | 12 | 12 |
| 2 | 2 | 2 | 4 | 4 | 4 | 6 | 6 | 8 | 8 | 10 | 12 | 12 | 12 | 12 | 12. |

The index values in IMPS are generated according to these rules, with appropriate clamping at the smallest $Q_e$.

ILPS is the table used to up-date the index I0 after an LPS. It has the same structure as IMPS, as the low order byte of I0 (I0B) is the index to the new $Q_e$ and the high order byte contains the new R0B rate byte. When R0B is zero, the LPS renormalization requires the index change listed in the second column of Table 4. When R0B is not zero, an extra change is made to the $Q_e$ index. XDEC is the table referenced by the rate to determine the extra amount decremented from the I0B index. One possible table has entries of

| | | | | | | | | | | | | | | | |
|---|---|---|---|---|---|---|---|---|---|---|---|---|---|---|---|
| 0 | 0 | 2 | 2 | 4 | 4 | 6 | 8 | 10 | 14 | 18 | 22 | 26 | 28 | 30 | 30 |
| 0 | 0 | 2 | 2 | 4 | 4 | 6 | 8 | 10 | 14 | 18 | 22 | 26 | 28 | 30 | 30. |

The index values in ILPS are generated according to these rules, with exchange of LPS and MPS sense when the index change would exceed the maximum $Q_e$.

AMIN determines when renormalization is needed.

T is a temporary variable to save intermediate results.

Figure 10:
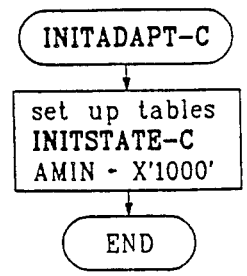

Referring now to FIG. 9 and FIG. 10, the operation INITADAPT is shown. INITADAPT initializes the probability adaptor. FIG. 9 shows the initialization for the case when A is a universal parameter. After setting up the tables, the AMIN is also initialized to '1000', which represents 0.75. INITSTATE-U (FIG. 11) block initializes the context storage. Then A is initialized to one and AMIN is initialized to '1000' which represents 0.75.

In FIG. 10 the INITADAPT-C block sets up tables and then loops within the INITSTATE-C (FIG. 12) block to initialize the context storage. The INITSTATE-C block differs from the INITSTATE-U block in that it also has to initialize A0(S) for each context.

Figure 11:
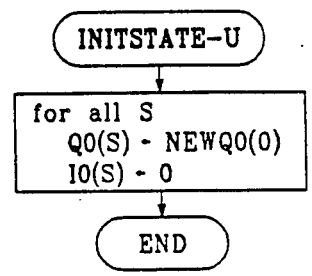
Figure 12:
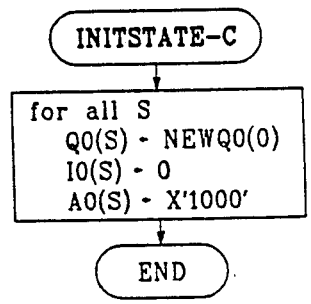

An example of initializing the context storage for each state is given in INITSTATE (FIG. 11 and FIG. 12). For speed in computation, the estimated LPS probability Q0(S) is stored for each state. Q0(S) is initialized to the first Q value in the NEWQ0 table. Since NEWQ0(0) is positive, MPS is assumed to be 0. The index of the LPS probability is also initialized to 0. This simultaneously sets both I0B(S) and R0B(S) to zero. The I0(S) could be set to fixed initial conditions for each state. Alternately, R0B might be set to the maximum rate so that adaptation would be rapid at first. For the context dependent case, A0(S) is initialized to X'1000'.

Figure 14:
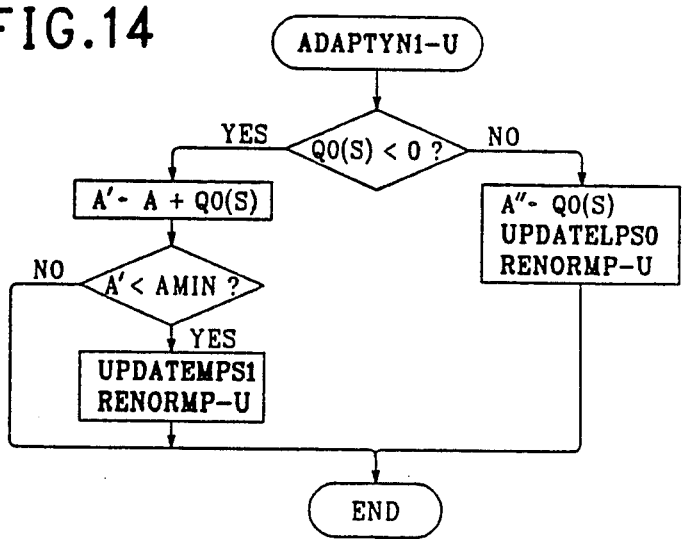
Figure 34:
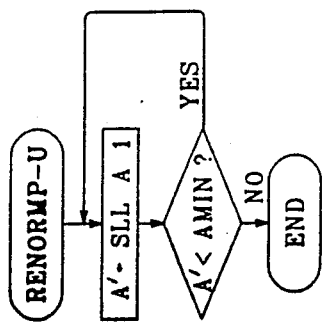

ADAPT (FIG. 13) shows the two paths taken according to whether YN is 1 or 0 during the probability adaptation. Note that MPS and Q0(S) are used externally before this adaptation occurs. ADAPTYN1-U (FIG. 14) adapts the probability for YN=1. If Q0(S)<0, an MPS symbol has occurred. A is decreased by adding the negative Q0. For the universal case, a single A is used for all states. On the MPS path if A is less than AMIN, then Q0 will be decreased in UPDATEMPS1 (FIG. 18, FIG. 19, FIG. 20 and FIG. 21). The RENORMP-U (FIG. 34) block renormalizes A. If Q0 was positive (zero is not allowed), A is set to $Q_0$, and the Q0 is increased in the UPDATELPS0 block. Since Q0 is always less than AMIN, renormalization is required.

Figure 15:
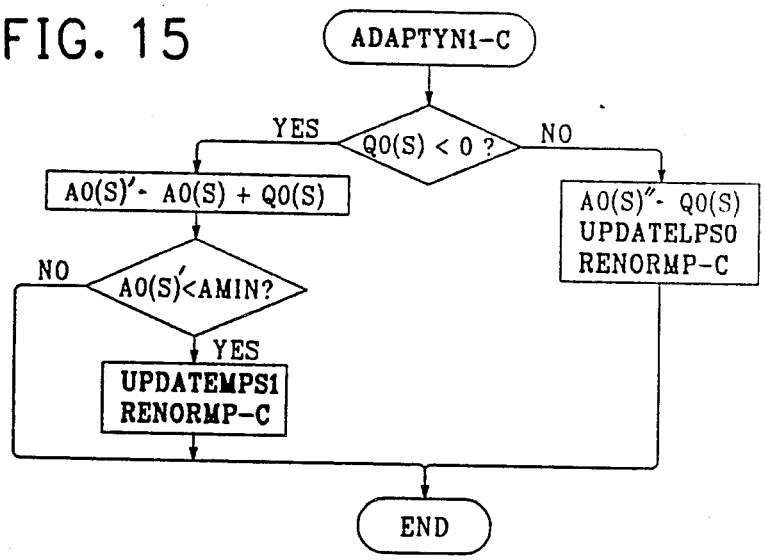
Figure 16:
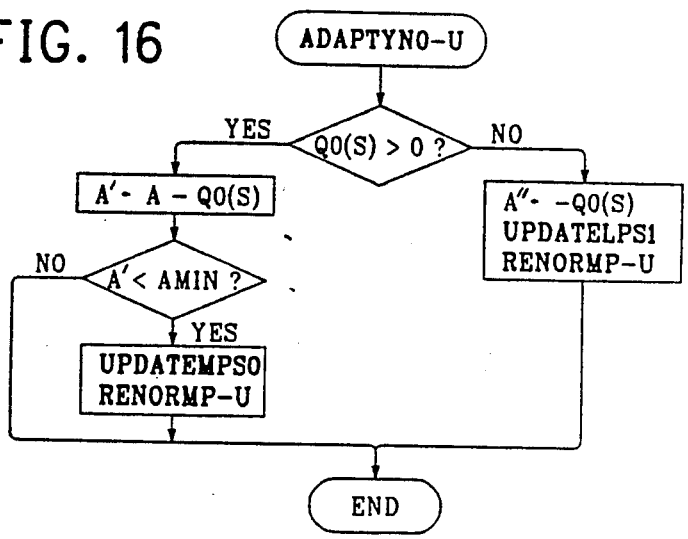
Figure 17:
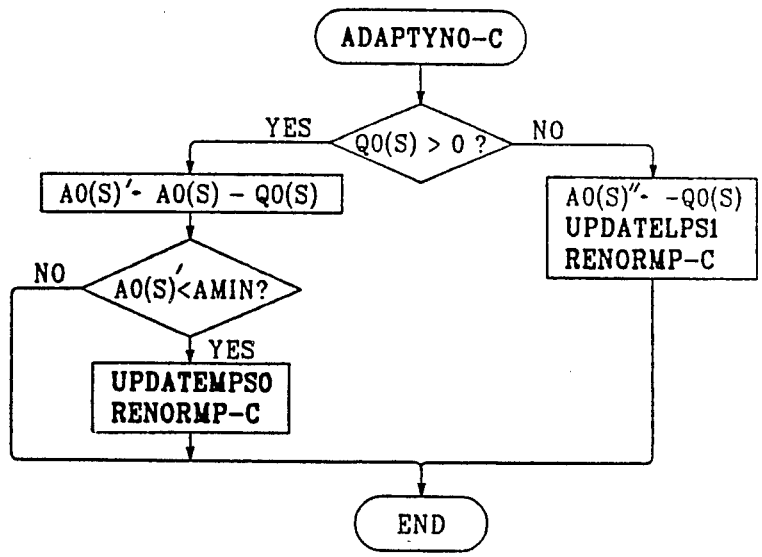
Figure 35:
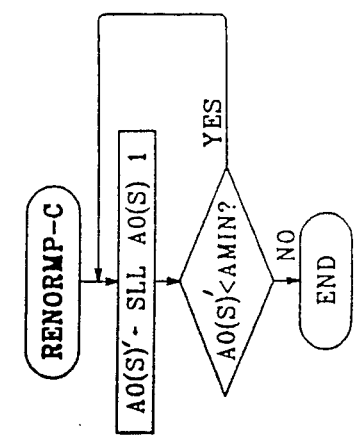

ADAPTYN1-C (FIG. 15) shows a similar adaptation process for YN=1 for the case of context dependent A0(S). However, instead of a single A, each state saves its own A0(S). The RENORMP-C (FIG. 35) block renormalizes A0(S). ADAPTYN0-U (FIG. 16) adapts the probability for YN=0. The MPS path is to be taken when Q0(S) is positive. A is decreased by Q0 before checking if A is less than AMIN. If so, Q0 will be decreased in UPDATEMPS0 (FIG. 22, FIG. 23, FIG. 24 and FIG. 25) and then RENORMP-U called for renormalization. On the LPS path, A must be set to the negative of Q0, since Q0 is negative for MPS=1. Q0 is increased in UPDATELPS1 (FIG. 26, FIG. 27, FIG. 28 and FIG. 29) and then renormalization is necessary. The context dependent case for ADAPTYN0-C (FIG. 17) follows the same process except that the context dependent A0(S) is used instead of A.

The logic of the probability updating processes are illustrated for both the single rate (-SL) and multi-rate (-ML) versions. The same result is achieved in the preferred embodiment with a finite state machine implementation for the single rate (-SF) and multi-rate (-MF) versions. The flow charts for the logical versions have table limits explicitly given by name even though for a given $Q_e$ table the values can be set to constants. (Note that the $Q_e$ entries are each two bytes). The following table defines these table limits for the 5 and 6 bit $Q_e$ tables. The A version for the 5 bit $Q_e$ was used to generate the finite state machine. The B version has the MPS=1 table starting at hex 80 so that the most significant bit in the byte will be set. This simplifies construction of the tables for the multi-rate version (6 bit $Q_e$ and 12 bit total context). For the 12 bit context, the B version was used. For an MPS =0, the value table entries are from IMIN0 to IMAX0 inclusive. The MPS =1 table will be from IMIN1 to IMAX1 inclusive.

| | $Q_e$ table limits | | | |
| | 5 bit $Q_e$ | | 6 bit $Q_e$ | |
| | A | B | A | B |
| --- | --- | --- | --- | --- |
| IMIN0 | 0 | 0 | 0 | 0 |
| IMAX0 | 3A | 3A | 78 | 78 |
| IMIN1 | 3C | 80 | 7A | 80 |
| IMAX1 | 76 | BA | F2 | F8 |

Figure 18:
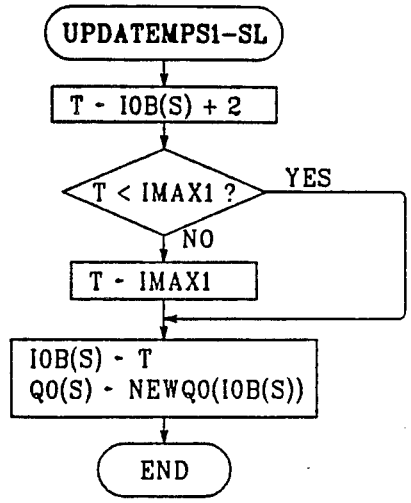
Figure 19:
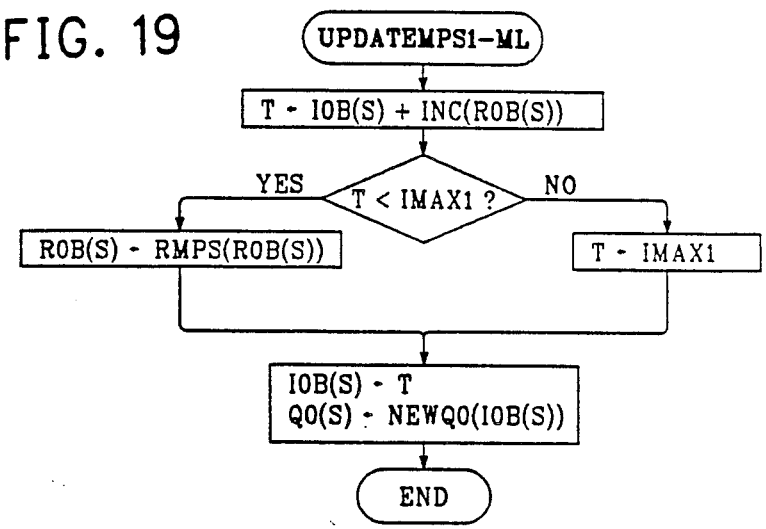
Figure 20:
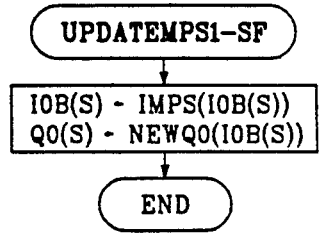
Figure 21:
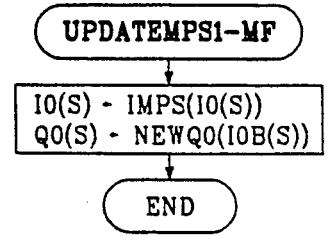
Figure 22:
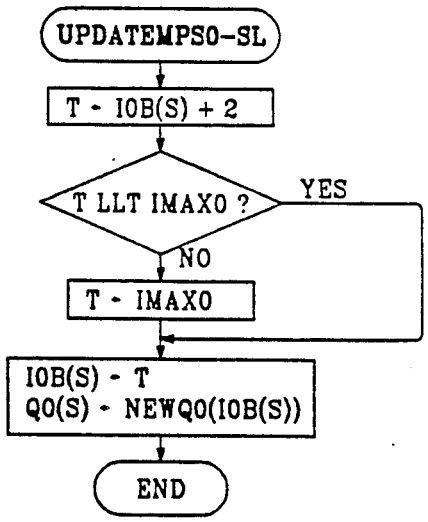
Figure 23:
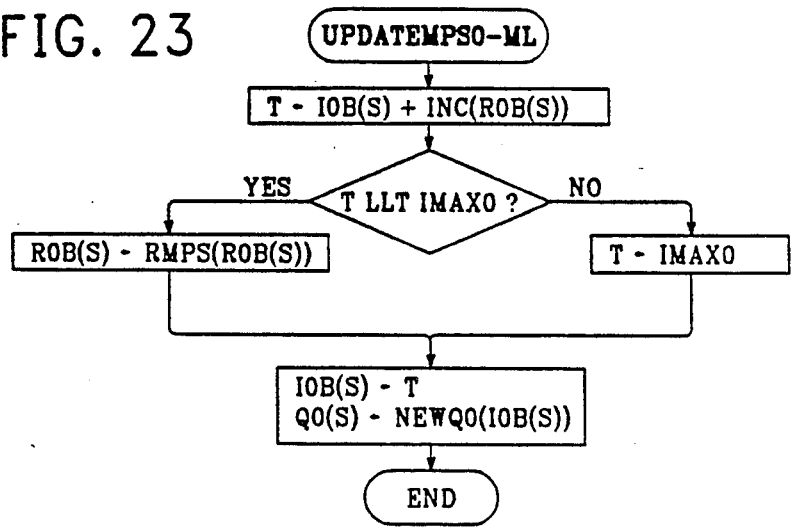
Figure 24:
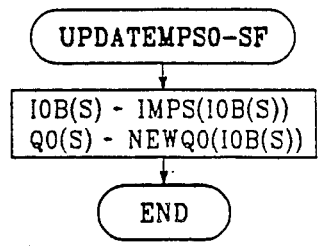
Figure 25:
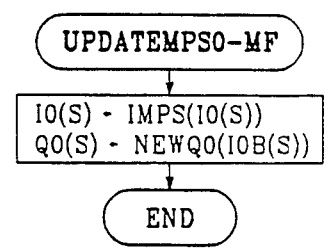
Figure 26:
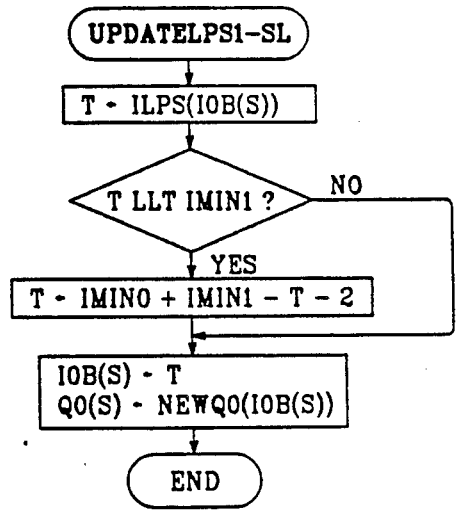
Figure 27:
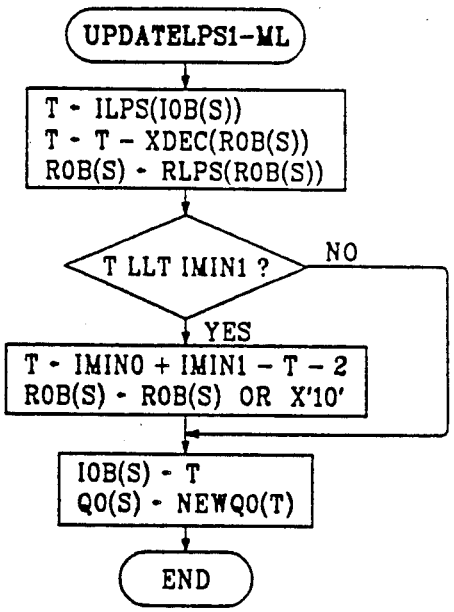
Figure 28:
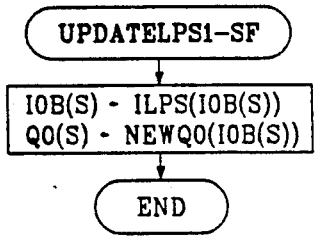
Figure 29:
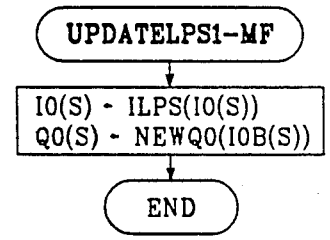

The single rate version in its logical form for the MPS path for YN=1 is shown in UPDATEMPS1-SL (FIG. 18). The next table entry is calculated by adding 2 (2 byte table entries) to I0B(S) and is saved in the temporary variable T. If T is not less than IMAX1, then it is set to IMAX1. T is stored at I0B(S) and the new Q0 looked up in the NEWQ0 table.

The multi-rate process UPDATEMPS1-ML (FIG. 19) is slightly more complex. The increment added to the old I0B is a function of the rate R0B. If the result is less than IMAX1, the rate is updated through the RMPS table. Otherwise, the new I0B is reset to IMAX1 and the rate is not changed. After storing the new I0B, a new Q0 is looked up and saved.

The single rate finite state machine implementation of the probability update on the MPS path for YN=1 UPDATEMPS1-SF (FIG. 20) finds the new I0B in the IMPS table at the old I0B location. Then a new $Q_0$ is found at the new I0B location in the NEWQ0 table. Instead of I0B, I0 could have been used because R0B is always 0. For the multi-rate finite state machine case UPDATEMPS1-MF (FIG. 21) the entire I0(S) must be used to find the new I0(S) in the IMPS table. Then the new Q0 can be found in the NEWQ0 table using just the low order byte I0B.

The logical versions of the MPS path update for YN=0, UPDATEMPS0-SL (FIG. 22) and UPDATEMPS0-ML (FIG. 23), are similar to the YN=1 path except that IMAX0 is used instead of IMAX1 and a logical comparison is made instead of an arithmetic signed comparison. The finite state machine versions for YN=0, UPDATEMPS0-SF (FIG. 24) and UPDATEMPS0-MF (FIG. 25), are identical to the YN=1 cases, since the MPS distinction is contained in I0B.

Updating the estimated probability on the LPS path for the single rate logical version (UPDATELPS1-SL FIG. 26) starts with looking up the new indicator in the ILPS table. If the result is logically less than IMIN1 (i.e. the result is not in the table so an MPS exchange is needed), a new index is calculated by subtracting from IMIN1 minus 2 the calculated value and then adding it to IMIN0. The index is stored in I0B and a new Q0 is looked up in the NEWQ0 table. The multi-rate logical LPS update for YN=1 (UPDATELPS1-ML FIG. 27) also starts by looking up the new index in the ILPS table. Then an extra decrement which is a function of the current rate R0B is subtracted. The new rate can be found in the RLPS table. If the calculated index temporarily in T is logically less that IMIN1, a new index which accounts for the MPS exchange is found and the bit which flags the sense of the renormalization is flipped to indicate an MPS last. The calculated index is stored in I0B and the new $Q_0$ looked up in the NEWQ0 table.

The finite state machine versions of the single and multirate versions (UPDATELPS1-SF FIG. 28 and UPDATELPS-MF FIG. 29) look up the new index either as a byte or two byte quantity in the ILPS table. Then the new Q0 is found in the NEWQ0 table.

Figure 30:
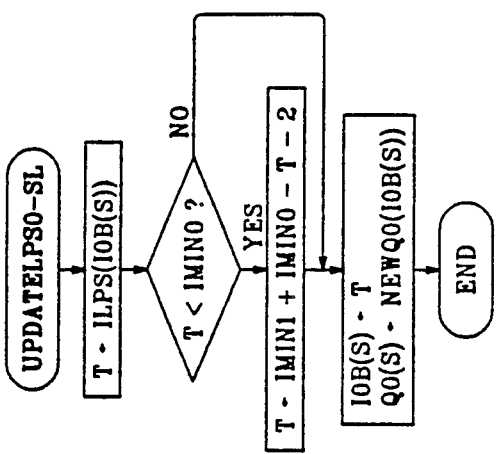

When YN=0, the updating LPS path process UPDATELPS0-SL (FIG. 30) looks up the new index in the ILPS table. If the new index is less than IMIN0 (i.e 0), an MPS exchange is needed. The new value with MPS exchange is calculated by subtracting from IMIN−2 the temporary index and then adding it to IMIN1. The new index is calculated and stored in I0B. Finally a new Q0 is looked up in the NEWQ0 table.

Figure 31:
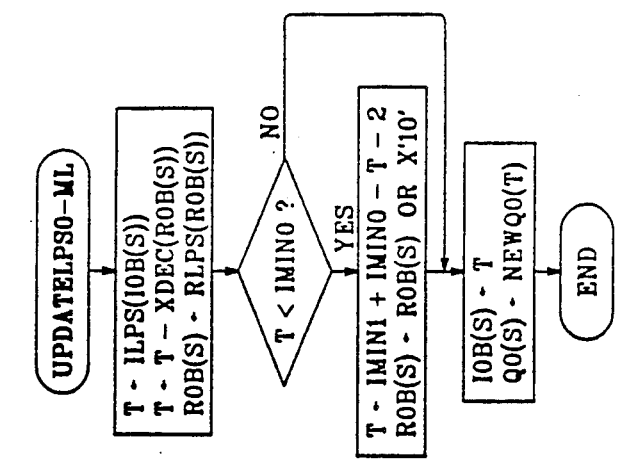

The multi-rate LPS update for YN=0 UPDATELPS0-ML (FIG. 31) decreases the new index obtained from the ILPS table by the extra decrement which is a function of the rate. The new rate is found in the RLPS table. If the calculated index is less than IMIN0, an MPS exchange is needed. The new index is calculated and the flag bit is forced to an MPS last. The index is stored and a new Q0 looked up.

Figure 32:
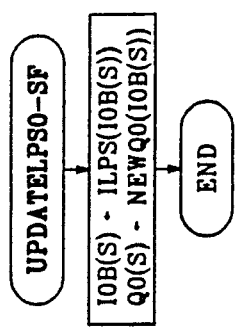
Figure 33:
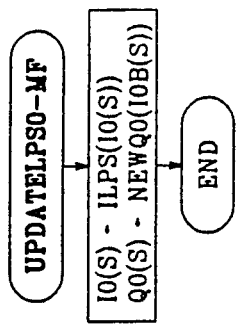

The finite state machine versions for the LPS path when YN=0 (UPDATELPS0-SF FIG. 32 and UPDATELPS0-MF FIG. 33) are exactly the same as the versions for YN=1.

RENORMP-U (FIG. 34) renormalizes the universal A value one bit at a time. A is shifted until it is no longer less than AMIN. The RENORMP-C (FIG. 35) is used when A is saved as a function of context. A0 is shifted until greater than AMIN.

The above flowcharts may be prepared in various software languages including the Program Development System Language which uses the forward Polish notation and may be run on any of various computers such as an IBM 370 system.

D. Test Sequence for a data set

An example of use of the present probability adaptor in an arithmetic coding environment is now depicted.

The test file was generated using a random number generator such that the probability of 0's in the binary sequence was 0.1875. The actual number of zeros in the file was 48, as expected. The initial Q value was set to hex '0A80' and the initial MPS was set to 0. Then a multi-rate 12 bit context with only one state was used.

In the following encoder tests, the "codebytes" are listed as they are output. Two bytes in that column list both a changed preceding byte along with the new byte.

Test data (in hexadecimal form):

EBB7FAFEBFEFD6C7F7FFF-
DFE7FFBDFF3FDFFFFF97F6F5F-
7FEB97BDF76EDD7E7FF

For this file the coded bit count is 208, including the overhead to flush the final data. The actual compressed data stream is (in hexadecimal form):

459BB80493E801627BB33497424C3D5D2B60D29-
D0ED7561B1C00

For this multi-rate embodiment having a twelve-bit context, the following Tables 4 and 5 demonstrate the encoding and decoding using probability adaptation. It is noted that the high order byte of I0 represent ROB and the low order byte represent I0B. "ec" is the event count. "I0" and "Q0", which together form qi0 referred to hereinabove, represent an index containing renormalization correlation information. "Y/N" represents the input data in binary form. The test data starts with EB ... which, in binary, is 1110 1011 —the first eight Y/N decision event inputs. "A" is the current augend value. "x" is the value of the most recent encoded portion of an arithmetic coded code stream.

The "codebytes" indicate the actual compressed data stream in hexadecimal notation. Table 5 shows encoding and Table 6 below shows the decoding process in which the Q/P ordering is inverted. Methodology relating to the encoding and decoding is set forth in the above-mentioned co-pending application relating to arithmetic coding selectively employing disparate encoders and decoders.

II. Word/Speech Recognition Embodiment and Other Embodiments

Figure 36:
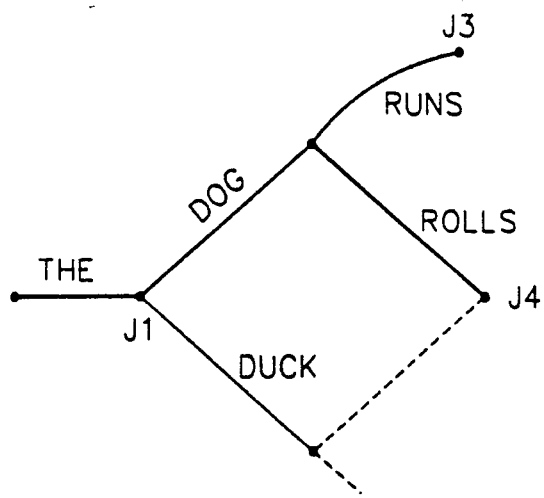
FIG. 36 is an illustration depicting a word/speech recognition environment to which the present invention is applicable.

The present invention is applicable to any environment in which a estimated probability $Q_e$ is to be adapted based on a history of decision events. One example of such a further embodiment relates to selecting an appropriate word path from a plurality of word paths arranged in a tree. Such an arrangement is shown in FIG.36. In FIG.36, the word "THE" may be followed by "DOG" or "DUCK" at junction J1. For convenience, the decision at junction J1 is a simple binary decision between two possible events.

Initially there is a relative probability for each event —"DOG" and "DUCK" —such that the probability of one of the two events is less than the probability of the other event and thus estimated by $Q_e$.

As the junction J1 is reached a number of times, the respective probabilities of the two events may vary. For example, the $Q_e$ value may be 0.10 where $Q_e$ indicates the probability of the word "DUCK" following the word "THE", the probability of the word "DOG" thereby being 0.90. If, for the next one hundred times the junction J1 is traversed, "DUCK" occurs once and "DOG" occurs ninety-nine times, the prior estimate of $Q_e=0.10$ should be adjusted. The adjustment of $Q_e$ is made in accordance with the invention.

First, an augend A is defined at an initial value, e.q. one. Each time the junction J1 is traversed, a determination is made whether the MPS event (in this instance, the word "DOG") or the LPS event (in this instance, the word "DUCK") has occurred. If there is an LPS event, the initial value of the augend A is set equal to the initial value set for the estimated probability multiplied by the previous value for A, or $A \times Q_e$.

When A is held near a value of one, A is set equal to simply $Q_e$.

If the value of A falls below a predetermined threshold AMIN, it is increased by one or more prescribed amounts until the increased, or renormalized, A value is at least equal to the value of AMIN. Preferably, AMIN is greater than 0.5 so that each LPS event results in a renormalization of the A value. As noted hereinabove, the increase is preferably by powers of two so that the value of A is successively doubled until the doubled result is not less than AMIN. For the LPS event, the value of $Q_e$ is also changed to a higher value. The value may be incremented by a known amount or may, as described hereinabove for the arithmetic coding embodiment, be moved to a higher value listed in a $Q_e$ table.

For an MPS event, the augend value is reduced according to the expression:

$$A' \leftarrow A - A \times Q_e,$$

which simplifies to $$A' \leftarrow A - Q_e,$$

when A is maintained near a value of one. If A' is greater than or equal to AMIN, the value for $Q_e$ remains unchanged. In the event that A drops below AMIN, the value of A' is increased (e.g., doubled) until it exceeds AMIN and the value of $Q_e$ is reduced.

Implicit in this strategy is the notion that if an LPS occurs, the $Q_e$ value is too low, whereas if enough MPS events occur to cause an MPS augend renormalization (before there is an LPS event), the $Q_e$ value is too high.

By way of example, suppose that A is set at one, that AMIN is 0.75, that $Q_e$ which estimates the likelihood of the word "DUCK" occurring at junction J1 is valued at 0.35, and that other estimated probability values in a table (not shown) include 0.375 as the next higher adjacent value and 0.34 as the next lower adjacent value. If junction J1 is traversed and the recognized word is determined to be "DUCK", the value of A drops to 0.35, which is doubled to 0.70 and re-doubled to 1.4 in order to exceed AMIN. And the value of $Q_e$ increments to 0.375.

If in the above example, an MPS event (the word "DOG") was recognized, the value of A would have been reduced to (1.0−0.35)=0.65 which is less than AMIN. A would be doubled to a value of 1.3 which exceeds AMIN. And $Q_e$ would be decremented in response to the MPS augend renormalization.

Junction J1 may be viewed as one context. Similarly junction J2 may be viewed as a second context. Additional junctions would similarly represent respective contexts.

As in the arithmetic coding environment, each context may have its own augend value or, alternatively, a common running augend may be applied to all of the contexts. In the latter instance, the augend resulting after junction J1 follows the "DOG" path would then be applied to junction J2. The augend resulting from the decision made at junction J2 would then be applied to the decision to be made at junction J3 or J4 as appropriate.

It is thus noted that the teachings of the present invention are applicable to a wide variety of applications —namely wherever a probability estimator is to be adapted based on a history of earlier decisions which affect the probability.

It is further observed that the binary decisions discussed hereinabove may involve decisions in which more than two outcomes may result for a given decision, such multiple decisions being re-formulated as a set of binary decisions.

The preferred embodiment has been described in terms of renormalization by doubling of A when A is less than a prescribed limit AMIN. Other renormalization conventions may be used, such as setting A to a fixed known value when A is less than AMIN.

While the invention has been described with reference to preferred embodiments thereof, it will be understood by those skilled in the art that various changes in form and details may be made without departing from the scope of the invention.

TABLE 1

| $Q_e$ | I(dQ) |
|---|---|
| hex 0ac0 | 2 |
| hex 0a80 | 2 |
| hex 0a00 | 2 |
| hex 0900 | 2 |
| hex 0700 | 2 |
| hex 0680 | 2 |
| hex 0600 | 2 |
| hex 0500 | 4 |
| hex 0480 | 4 |
| hex 0440 | 4 |
| hex 0380 | 4 |
| hex 0300 | 4 |
| hex 02c0 | 4 |
| hex 0280 | 4 |
| hex 0240 | 4 |
| hex 0180 | 4 |
| hex 0120 | 4 |
| hex 00e0 | 4 |
| hex 00a0 | 4 |
| hex 0070 | 4 |
| hex 0060 | 4 |
| hex 0054 | 4 |
| hex 0028 | 4 |
| hex 0018 | 4 |
| hex 0014 | 6 |
| hex 000a | 4 |
| hex 0007 | 6 |
| hex 0005 | 4 |
| hex 0003 | 6 |
| hex 0001 | 4 |

TABLE 2

| qi0 | |
|---|---|
| q0 | i0 |
| hex f540 | hex 0078 |
| hex 0ac0 | hex 0000 |
| hex 0a80 | hex 0004 |
| hex 0a00 | hex 0008 |
| hex 0900 | hex 000c |
| hex 0700 | hex 0010 |
| hex 0680 | hex 0014 |
| hex 0680 | hex 0014 |
| hex 0600 | hex 0018 |
| hex 0500 | hex 001c |
| hex 0480 | hex 0020 |
| hex 0440 | hex 0024 |
| hex 0380 | hex 0028 |
| hex 0300 | hex 002c |
| hex 02c0 | hex 0030 |
| hex 0280 | hex 0034 |
| hex 0240 | hex 0038 |
| hex 0180 | hex 003c |
| hex 0120 | hex 0040 |
| hex 00e0 | hex 0044 |
| hex 00a0 | hex 0048 |
| hex 0070 | hex 004c |
| hex 0060 | hex 0050 |
| hex 0054 | hex 0054 |
| hex 0054 | hex 0054 |
| hex 0018 | hex 005c |
| hex 0018 | hex 005c |
| hex 000a | hex 0064 |
| hex 000a | hex 0064 |
| hex 0005 | hex 006c |
| hex 0ac0 | hex 0000 |
| hex f540 | hex 0078 |
| hex f580 | hex 007c |
| hex f600 | hex 0080 |
| hex f700 | hex 0084 |
| hex f900 | hex 0088 |
| hex f980 | hex 008c |
| hex f980 | hex 008c |
| hex fa00 | hex 0090 |
| hex fb00 | hex 0094 |
| hex fb80 | hex 0098 |
| hex fbc0 | hex 009c |
| hex fc80 | hex 00a0 |
| hex fd00 | hex 00a4 |

TABLE 2-continued

| q0 | qi0 i0 |
|---|---|
| hex fd40 | hex 00a8 |
| hex fd80 | hex 00ac |
| hex fdc0 | hex 00b0 |
| hex fe80 | hex 00b4 |
| hex fee0 | hex 00b8 |
| hex ff20 | hex 00bc |
| hex ff60 | hex 00c0 |
| hex ff90 | hex 00c4 |
| hex ffa0 | hex 00c8 |
| hex ffac | hex 00cc |
| hex ffac | hex 00cc |
| hex ffe8 | hex 00d4 |
| hex ffe8 | hex 00d4 |
| hex fff6 | hex 00dc |
| hex fff6 | hex 00dc |
| hex fffb | hex 00e4 |

TABLE 3

| q0 | qi0 i0 |
|---|---|
| hex 0a80 | hex 0004 |
| hex 0a00 | hex 0008 |
| hex 0900 | hex 000c |
| hex 0700 | hex 0010 |
| hex 0680 | hex 0014 |
| hex 0600 | hex 0018 |
| hex 0500 | hex 001c |
| hex 0480 | hex 0020 |
| hex 0440 | hex 0024 |
| hex 0380 | hex 0028 |
| hex 0300 | hex 002c |
| hex 02c0 | hex 0030 |
| hex 0280 | hex 0034 |
| hex 0240 | hex 0038 |
| hex 0180 | hex 003c |
| hex 0120 | hex 0040 |
| hex 00e0 | hex 0044 |
| hex 00a0 | hex 0048 |
| hex 0070 | hex 004c |
| hex 0060 | hex 0050 |
| hex 0054 | hex 0054 |
| hex 0028 | hex 0058 |
| hex 0018 | hex 005c |
| hex 0014 | hex 0060 |
| hex 000a | hex 0064 |
| hex 0007 | hex 0068 |
| hex 0005 | hex 006c |
| hex 0003 | hex 0070 |
| hex 0001 | hex 0074 |
| hex 0001 | hex 0074 |
| hex f580 | hex 007c |
| hex f600 | hex 0080 |
| hex f700 | hex 0084 |
| hex f900 | hex 0088 |
| hex f980 | hex 008c |
| hex fa00 | hex 0090 |
| hex fb00 | hex 0094 |
| hex fb80 | hex 0098 |
| hex fbc0 | hex 009c |
| hex fc80 | hex 00a0 |
| hex fd00 | hex 00a4 |
| hex fd40 | hex 00a8 |
| hex fd80 | hex 00ac |
| hex fdc0 | hex 00b0 |
| hex fe80 | hex 00b4 |
| hex fee0 | hex 00b8 |
| hex ff20 | hex 00bc |
| hex ff60 | hex 00c0 |
| hex ff90 | hex 00c4 |
| hex ffa0 | hex 00c8 |
| hex ffac | hex 00cc |
| hex ffd8 | hex 00d0 |
| hex ffe8 | hex 00d4 |
| hex ffec | hex 00d8 |
| hex fff6 | hex 00dc |
| hex fff9 | hex 00e0 |
| hex fffb | hex 00e4 |

TABLE 3-continued

| q0 | qi0 i0 |
|---|---|
| hex fffd | hex 00e8 |
| hex ffff | hex 00ec |
| hex ffff | hex 00ec |

TABLE 4

| $Q_e$ | I(dQ) |
|---|---|
| hex 0a80 | 2 |
| hex 0a00 | 2 |
| hex 0980 | 2 |
| hex 0900 | 2 |
| hex 08a0 | 2 |
| hex 07c0 | 2 |
| hex 0760 | 2 |
| hex 0700 | 2 |
| hex 06c0 | 2 |
| hex 0680 | 2 |
| hex 0640 | 2 |
| hex 0600 | 2 |
| hex 0580 | 2 |
| hex 0500 | 4 |
| hex 04c0 | 2 |
| hex 04a0 | 2 |
| hex 0480 | 4 |
| hex 0460 | 2 |
| hex 0440 | 4 |
| hex 0420 | 4 |
| hex 03c0 | 2 |
| hex 0380 | 2 |
| hex 0340 | 2 |
| hex 0300 | 2 |
| hex 02e0 | 4 |
| hex 02c0 | 2 |
| hex 02a0 | 2 |
| hex 0280 | 4 |
| hex 0260 | 2 |
| hex 0240 | 4 |
| hex 0220 | 4 |
| hex 01e0 | 2 |
| hex 01a0 | 4 |
| hex 0180 | 2 |
| hex 0160 | 4 |
| hex 0140 | 2 |
| hex 0130 | 4 |
| hex 0120 | 4 |
| hex 00f0 | 2 |
| hex 00e0 | 4 |
| hex 00c0 | 2 |
| hex 00a0 | 4 |
| hex 0090 | 4 |
| hex 0078 | 2 |
| hex 0070 | 4 |
| hex 0060 | 2 |
| hex 0054 | 4 |
| hex 0048 | 4 |
| hex 0038 | 2 |
| hex 0030 | 2 |
| hex 0028 | 4 |
| hex 0024 | 4 |
| hex 0018 | 2 |
| hex 0014 | 4 |
| hex 0012 | 4 |
| hex 000c | 4 |
| hex 000a | 4 |
| hex 0007 | 4 |
| hex 0005 | 4 |
| hex 0003 | 4 |
| hex 0001 | 4 |

TABLE 5

| ec | I0 | Q0 | YN | A | x | bits codebytes |
|---|---|---|---|---|---|---|
| 0 | 0000 | 0a80 |   | 00001000 | 01801000 | 0 |
| 1 | 1180 | f580 | 1 | 00001500 | 03001500 | 1 |
| 2 | 1282 | f600 | 1 | 00001500 | 06002a00 | 2 |
| 3 | 1384 | f680 | 1 | 00001600 | 0c005400 | 3 |

TABLE 5-continued

| ec | I0 | Q0 | YN | A | x | bits | codebytes |
|---|---|---|---|---|---|---|---|
| 4 | 0180 | f580 | 0 | 00001300 | 18008f00 | 4 | |
| 5 | 1082 | f600 | 1 | 00001100 | 30011e00 | 5 | |
| 6 | 0080 | f580 | 0 | 00001400 | 60022e00 | 6 | |
| 7 | 1082 | f600 | 1 | 00001300 | c0045c00 | 7 | |
| 8 | 1184 | f680 | 1 | 00001200 | 01801800 | 8 | 45 |
| 9 | 1286 | f700 | 1 | 00001100 | 03003000 | 9 | |
| 10 | 0082 | f600 | 0 | 00001200 | 06005000 | 10 | |
| 11 | 1084 | f680 | 1 | 00001000 | 0c00a000 | 11 | |
| 12 | 1186 | f700 | 1 | 00001a00 | 30028000 | 13 | |
| 13 | 0084 | f680 | 0 | 00001200 | 6004de00 | 14 | |
| 14 | 1086 | f700 | 1 | 00001100 | c009bc00 | 15 | |
| 15 | 1188 | f760 | 1 | 00001000 | 01801800 | 16 | 9b |
| 16 | 128a | f840 | 1 | 00001d80 | 06006000 | 18 | |
| 17 | 128a | f840 | 1 | 000015c0 | 06006000 | 18 | |
| 18 | 138c | f8a0 | 1 | 00001c00 | 0c00c000 | 19 | |
| 19 | 138c | f8a0 | 1 | 000014a0 | 0c00c000 | 19 | |
| 20 | 1490 | f940 | 1 | 00001a80 | 18018000 | 20 | |
| 21 | 1490 | f940 | 1 | 000013c0 | 18018000 | 20 | |
| 22 | 028a | f840 | 0 | 00001b00 | 6005cc00 | 22 | |
| 23 | 028a | f840 | 1 | 00001340 | 6005cc00 | 22 | |
| 24 | 0386 | f700 | 0 | 00001f00 | 01800200 | 24 | b8 |
| 25 | 0386 | f700 | 1 | 00001600 | 01800200 | 24 | |
| 26 | 118a | f840 | 1 | 00001a00 | 03000400 | 25 | |
| 27 | 118a | f840 | 1 | 00001240 | 03000400 | 25 | |
| 28 | 128c | f8a0 | 1 | 00001500 | 06000800 | 26 | |
| 29 | 138e | f900 | 1 | 00001b40 | 0c001000 | 27 | |
| 30 | 138e | f900 | 1 | 00001440 | 0c001000 | 27 | |
| 31 | 1492 | f980 | 1 | 00001a80 | 18002000 | 28 | |
| 32 | 028c | f8a0 | 0 | 00001a00 | 60003000 | 30 | |
| 33 | 028c | f8a0 | 1 | 000012a0 | 60003000 | 30 | |
| 34 | 0388 | f760 | 0 | 00001d80 | 01801300 | 32 | 04 |
| 35 | 0388 | f760 | 1 | 000014e0 | 001801300 | 32 | |
| 36 | 118c | f8a0 | 1 | 00001880 | 03002600 | 33 | |
| 37 | 118c | f8a0 | 1 | 00001120 | 03002600 | 33 | |
| 38 | 128e | f900 | 1 | 00001380 | 06004c00 | 34 | |
| 39 | 1390 | f940 | 1 | 00001900 | 0c009800 | 35 | |
| 40 | 1390 | f940 | 1 | 00001240 | 0c009800 | 35 | |
| 41 | 1494 | f9c0 | 1 | 00001700 | 18013000 | 36 | |
| 42 | 1494 | f9c0 | 1 | 000010c0 | 18013000 | 36 | |
| 43 | 1598 | fa80 | 1 | 00001500 | 30026000 | 37 | |
| 44 | 0392 | f980 | 0 | 00001600 | c0094200 | 39 | |
| 45 | 1196 | fa00 | 1 | 00001f00 | 01800400 | 40 | 94 |
| 46 | 1196 | fa00 | 1 | 00001900 | 01800400 | 40 | |
| 47 | 1196 | fa00 | 1 | 00001300 | 01800400 | 40 | |
| 48 | 1298 | fa80 | 1 | 00001a00 | 03000800 | 41 | |
| 49 | 1298 | fa80 | 1 | 00001480 | 03000800 | 41 | |
| 50 | 139a | fb00 | 1 | 00001e00 | 06001000 | 42 | |
| 51 | 0194 | f9c0 | 0 | 00001400 | 17ffdc00 | 44 | |
| 52 | 1096 | fa00 | 1 | 00001b80 | 2fffb800 | 45 | |
| 53 | 0094 | f9c0 | 0 | 00001800 | bffe8a00 | 47 | |
| 54 | 0094 | f9c0 | 1 | 000011c0 | bffe8a00 | 47 | |
| 55 | 1096 | fa00 | 1 | 00001700 | 01801400 | 48 | 93 e8 |
| 56 | 0094 | f9c0 | 0 | 00001800 | 06000c00 | 50 | |
| 57 | 0094 | f9c0 | 1 | 000011c0 | 06000c00 | 50 | |
| 58 | 1096 | fa00 | 1 | 00001700 | 0c001800 | 51 | |
| 59 | 0094 | f9c0 | 0 | 00001800 | 30001c00 | 53 | |
| 60 | 0192 | f980 | 0 | 00001900 | c0002900 | 55 | |
| 61 | 0290 | f940 | 0 | 00001a00 | 03001a00 | 57 | 01 |
| 62 | 0290 | f940 | 1 | 00001340 | 03001a00 | 57 | |
| 63 | 1092 | f980 | 1 | 00001900 | 06003400 | 58 | |
| 64 | 1092 | f980 | 1 | 00001280 | 06003400 | 58 | |
| 65 | 1194 | f9c0 | 1 | 00001800 | 0c006800 | 59 | |
| 66 | 1194 | f9c0 | 1 | 000011c0 | 0c006800 | 59 | |
| 67 | 1296 | fa00 | 1 | 00001700 | 1800d000 | 60 | |
| 68 | 1296 | fa00 | 1 | 00001100 | 1800d000 | 60 | |
| 69 | 0092 | f980 | 0 | 00001800 | 60031400 | 62 | |
| 70 | 0092 | f980 | 1 | 00001180 | 60031400 | 62 | |
| 71 | 1094 | f9c0 | 1 | 00001600 | c0062800 | 63 | |
| 72 | 1196 | fa00 | 1 | 00001f80 | 01801000 | 64 | 62 |
| 73 | 1196 | fa00 | 1 | 00001980 | 01801000 | 64 | |
| 74 | 1196 | fa00 | 1 | 00001380 | 01801000 | 64 | |
| 75 | 1298 | fa80 | 1 | 00001b00 | 03002000 | 65 | |
| 76 | 1298 | fa80 | 1 | 00001580 | 03002000 | 65 | |
| 77 | 1298 | fa80 | 1 | 00001000 | 03002000 | 65 | |
| 78 | 139a | fb00 | 1 | 00001500 | 06004000 | 66 | |
| 79 | 139a | fb00 | 1 | 00001000 | 06004000 | 66 | |
| 80 | 149e | fb60 | 1 | 00001600 | 0c008000 | 67 | |
| 81 | 149e | fb60 | 1 | 00001160 | 0c008000 | 67 | |
| 82 | 15a2 | fba0 | 1 | 00001980 | 18010000 | 68 | |
| 83 | 15a2 | fba0 | 1 | 00001520 | 18010000 | 68 | |
| 84 | 15a2 | fba0 | 1 | 000010c0 | 18010000 | 68 | |
| 85 | 16a6 | fbe0 | 1 | 000018c0 | 30020000 | 69 | |
| 86 | 16a6 | fbe0 | 1 | 000014a0 | 30020000 | 69 | |
| 87 | 049c | fb40 | 0 | 00001080 | c007be00 | 71 | |
| 88 | 12a0 | fb80 | 1 | 00001780 | 01801c00 | 72 | 7b |
| 89 | 12a0 | fb80 | 1 | 00001300 | 01801c00 | 72 | |
| 90 | 13a2 | fba0 | 1 | 00001d00 | 03003800 | 73 | |
| 91 | 13a2 | fba0 | 1 | 000018a0 | 03003800 | 73 | |
| 92 | 13a2 | fba0 | 1 | 00001440 | 03003800 | 73 | |
| 93 | 14a6 | fbe0 | 1 | 00001fc0 | 06007000 | 74 | |
| 94 | 14a6 | fbe0 | 1 | 00001ba0 | 06007000 | 74 | |
| 95 | 14a6 | fbe0 | 1 | 00001780 | 06007000 | 74 | |
| 96 | 029e | fb60 | 0 | 00001080 | 18017280 | 76 | |
| 97 | 039a | fb00 | 0 | 00001280 | 60059a80 | 78 | |
| 98 | 119e | fb60 | 1 | 00001b00 | c00b3500 | 79 | |
| 99 | 119e | fb60 | 1 | 00001660 | c00b3500 | 79 | |
| 100 | 119e | fb60 | 1 | 000011c0 | c00b3500 | 79 | |
| 101 | 12a0 | fb80 | 1 | 00001a40 | 01800a00 | 80 | b3 |
| 102 | 12a0 | fb80 | 1 | 000015c0 | 01800a00 | 80 | |
| 103 | 12a0 | fb80 | 1 | 00001140 | 01800a00 | 80 | |
| 104 | 13a2 | fba0 | 1 | 00001980 | 03001400 | 81 | |
| 105 | 13a2 | fba0 | 1 | 00001520 | 03001400 | 81 | |
| 106 | 13a2 | fba0 | 1 | 000010c0 | 03001400 | 81 | |
| 107 | 14a6 | fbe0 | 1 | 000018c0 | 06002800 | 82 | |
| 108 | 14a6 | fbe0 | 1 | 000014a0 | 06002800 | 82 | |
| 109 | 14a6 | fbe0 | 1 | 00001080 | 06002800 | 82 | |
| 110 | 029e | fb60 | 0 | 00001080 | 18006e80 | 84 | |
| 111 | 10a0 | fb80 | 1 | 000017c0 | 3000dd00 | 85 | |
| 112 | 10a0 | fb80 | 1 | 00001340 | 3000dd00 | 85 | |
| 113 | 11a2 | fba0 | 1 | 00001d80 | 6001ba00 | 86 | |
| 114 | 11a2 | fba0 | 1 | 00001920 | 6001ba00 | 86 | |
| 115 | 00a0 | fb80 | 0 | 00001180 | 01801500 | 88 | 34 |
| 116 | 10a2 | fba0 | 1 | 00001a00 | 03002a00 | 89 | |
| 117 | 10a2 | fba0 | 1 | 000015a0 | 03002a00 | 89 | |
| 118 | 10a2 | fba0 | 1 | 00001140 | 03002a00 | 89 | |
| 119 | 11a4 | fbc0 | 1 | 000019c0 | 06005400 | 90 | |
| 120 | 11a4 | fbc0 | 1 | 00001580 | 06005400 | 90 | |
| 121 | 11a4 | fbc0 | 1 | 00001140 | 06005400 | 90 | |
| 122 | 12a6 | fbe0 | 1 | 00001a00 | 0c00a800 | 91 | |
| 123 | 12a6 | fbe0 | 1 | 000015e0 | 0c00a800 | 91 | |
| 124 | 12a6 | fbe0 | 1 | 000011c0 | 0c00a800 | 91 | |
| 125 | 00a0 | fb80 | 0 | 00001080 | 30026980 | 93 | |
| 126 | 019c | fb40 | 0 | 00001200 | c0097600 | 95 | |
| 127 | 109e | fb60 | 1 | 00001a80 | 01800c00 | 96 | 97 |
| 128 | 109e | fb60 | 1 | 000015e0 | 01800c00 | 96 | |
| 129 | 109e | fb60 | 1 | 00001140 | 01800c00 | 96 | |
| 130 | 11a0 | fb80 | 1 | 00001940 | 03001800 | 97 | |
| 131 | 11a0 | fb80 | 1 | 000014c0 | 03001800 | 97 | |
| 132 | 11a0 | fb80 | 1 | 00001040 | 03001800 | 97 | |
| 133 | 12a2 | fba0 | 1 | 00001780 | 06003000 | 98 | |
| 134 | 12a2 | fba0 | 1 | 00001320 | 06003000 | 98 | |
| 135 | 009e | fb60 | 0 | 00001180 | 18008500 | 100 | |
| 136 | 10a0 | fb80 | 1 | 000019c0 | 30010a00 | 101 | |
| 137 | 10a0 | fb80 | 1 | 00001540 | 30010a00 | 101 | |
| 138 | 10a0 | fb80 | 1 | 000010c0 | 30010a00 | 101 | |
| 139 | 11a2 | fba0 | 1 | 00001880 | 60021400 | 102 | |
| 140 | 11a2 | fba0 | 1 | 00001420 | 60021400 | 102 | |
| 141 | 12a4 | fbc0 | 1 | 00001f80 | c0042800 | 103 | |
| 142 | 12a4 | fbc0 | 1 | 00001b40 | c0042800 | 103 | |
| 143 | 12a4 | fbc0 | 1 | 00001700 | c0042800 | 103 | |
| 144 | 12a4 | fbc0 | 1 | 000012c0 | c0042800 | 103 | |
| 145 | 13a6 | fbe0 | 1 | 00001d00 | 01801000 | 104 | 42 |
| 146 | 13a6 | fbe0 | 1 | 000018e0 | 01801000 | 104 | |
| 147 | 13a6 | fbe0 | 1 | 000014c0 | 01801000 | 104 | |
| 148 | 13a6 | fbe0 | 1 | 000010a0 | 01801000 | 104 | |
| 149 | 14aa | fc80 | 1 | 00001900 | 03002000 | 105 | |
| 150 | 14aa | fc80 | 1 | 00001580 | 03002000 | 105 | |
| 151 | 14aa | fc80 | 1 | 00001200 | 03002000 | 105 | |
| 152 | 15ae | fd00 | 1 | 00001d00 | 06004000 | 106 | |
| 153 | 15ae | fd00 | 1 | 00001a00 | 06004000 | 106 | |
| 154 | 03a8 | fc40 | 0 | 00001800 | 30014800 | 109 | |
| 155 | 04a4 | fbc0 | 0 | 00001e00 | 01801e00 | 112 | 4c |
| 156 | 04a4 | fbc0 | 1 | 000019c0 | 01801e00 | 112 | |
| 157 | 059c | fb40 | 0 | 00001100 | 06002200 | 114 | |
| 158 | 13a0 | fb80 | 1 | 00001880 | 0c004400 | 115 | |
| 159 | 13a0 | fb80 | 1 | 00001400 | 0c004400 | 115 | |
| 160 | 14a4 | fbc0 | 1 | 00001f00 | 18008800 | 116 | |
| 161 | 14a4 | fbc0 | 1 | 00001ac0 | 18008800 | 116 | |
| 162 | 14a4 | fbc0 | 1 | 00001680 | 18008800 | 116 | |
| 163 | 14a4 | fbc0 | 1 | 00001240 | 18008800 | 116 | |
| 164 | 15a8 | fc40 | 1 | 00001c00 | 30011000 | 117 | |
| 165 | 03a2 | fba0 | 0 | 00001e00 | 01801e00 | 120 | 3d |

TABLE 5-continued

| ec | I0 | Q0 | YN | A | x | bits | codebytes |
|---|---|---|---|---|---|---|---|
| 166 | 03a2 | fba0 | 1 | 000019a0 | 01801e00 | 120 | |
| 167 | 03a2 | fba0 | 1 | 00001540 | 01801e00 | 120 | |
| 168 | 049e | fb60 | 0 | 00001180 | 06003480 | 122 | |
| 169 | 12a2 | fba0 | 1 | 000019c0 | 0c006900 | 123 | |
| 170 | 12a2 | fba0 | 1 | 00001560 | 0c006900 | 123 | |
| 171 | 12a2 | fba0 | 1 | 00001100 | 0c006900 | 123 | |
| 172 | 13a4 | fbc0 | 1 | 00001940 | 1800d200 | 124 | |
| 173 | 019e | fb60 | 0 | 00001100 | 6002f400 | 126 | |
| 174 | 10a0 | fb80 | 1 | 000018c0 | c005e800 | 127 | |
| 175 | 009c | fb40 | 0 | 00001200 | 03000f00 | 129 | 5d |
| 176 | 109e | fb60 | 1 | 00001a80 | 06001e00 | 130 | |
| 177 | 109e | fb60 | 1 | 000015e0 | 06001e00 | 130 | |
| 178 | 109e | fb60 | 1 | 00001140 | 06001e00 | 130 | |
| 179 | 11a0 | fb80 | 1 | 00001940 | 0c003c00 | 131 | |
| 180 | 11a0 | fb80 | 1 | 000014c0 | 0c003c00 | 131 | |
| 181 | 009c | fb40 | 0 | 00001200 | 3000af00 | 133 | |
| 182 | 109e | fb60 | 1 | 00001a80 | 60015e00 | 134 | |
| 183 | 109e | fb60 | 1 | 000015e0 | 60015e00 | 134 | |
| 184 | 109e | fb60 | 1 | 00001140 | 60015e00 | 134 | |
| 185 | 11a0 | fb80 | 1 | 00001a80 | c002bc00 | 135 | |
| 186 | 11a0 | fb80 | 1 | 000014c0 | c002bc00 | 135 | |
| 187 | 11a0 | fb80 | 1 | 00001040 | c002bc00 | 135 | |
| 188 | 12a2 | fba0 | 1 | 00001780 | 01801800 | 136 | 2b |
| 189 | 12a2 | fba0 | 1 | 00001320 | 01801800 | 136 | |
| 190 | 13a4 | fbc0 | 1 | 00001d80 | 03003000 | 137 | |
| 191 | 13a4 | fbc0 | 1 | 00001940 | 03003000 | 137 | |
| 192 | 019e | fb60 | 0 | 00001100 | 0c006c00 | 139 | |
| 193 | 10a0 | fb80 | 1 | 000018c0 | 1800d800 | 140 | |
| 194 | 009c | fb40 | 0 | 00001200 | 60030f00 | 142 | |
| 195 | 109e | fb60 | 1 | 00001a80 | c0061e00 | 143 | |
| 196 | 109e | fb60 | 1 | 000015e0 | c0061e00 | 143 | |
| 197 | 109e | fb60 | 1 | 00001140 | c0061e00 | 143 | |
| 198 | 009c | fb40 | 0 | 00001280 | 03000580 | 145 | 61 |
| 199 | 019a | fb00 | 0 | 00001300 | 0bffdf00 | 147 | |
| 200 | 109c | fb40 | 1 | 00001c00 | 17ffbe00 | 148 | |
| 201 | 009a | fb00 | 0 | 00001300 | 5ffe9b00 | 150 | |
| 202 | 109c | fb40 | 1 | 00001c00 | bffd3600 | 151 | |
| 203 | 109c | fb40 | 1 | 00001740 | bffd3600 | 151 | |
| 204 | 109c | fb40 | 1 | 00001280 | bffd3600 | 151 | |
| 205 | 119e | fb60 | 1 | 00001b80 | 01800c00 | 152 | 60 d3 |
| 206 | 009c | fb40 | 0 | 00001280 | 05ffd480 | 154 | |
| 207 | 109e | fb60 | 1 | 00001b80 | 0bffa900 | 155 | |
| 208 | 109e | fb60 | 1 | 000016e0 | 0bffa900 | 155 | |
| 209 | 109e | fb60 | 1 | 00001240 | 0bffa900 | 155 | |
| 210 | 11a0 | fb80 | 1 | 00001b40 | 17ff5200 | 156 | |
| 211 | 009c | fb40 | 0 | 00001200 | 5ffced00 | 158 | |
| 212 | 109e | fb60 | 1 | 00001a80 | bff9da00 | 159 | |
| 213 | 109e | fb60 | 1 | 000015e0 | bff9da00 | 159 | |
| 214 | 109e | fb60 | 1 | 00001140 | bff9da00 | 159 | |
| 215 | 11a0 | fb80 | 1 | 00001940 | 01801400 | 160 | d2 9d |
| 216 | 11a0 | fb80 | 1 | 000014c0 | 01801400 | 160 | |
| 217 | 009c | fb40 | 0 | 00001200 | 06000f00 | 162 | |
| 218 | 109e | fb60 | 1 | 00001a80 | 0c001e00 | 163 | |
| 219 | 109e | fb60 | 1 | 000015e0 | 0c001e00 | 163 | |
| 220 | 109e | fb60 | 1 | 00001140 | 0c001e00 | 163 | |
| 221 | 009c | fb40 | 0 | 00001280 | 30004580 | 165 | |
| 222 | 109e | fb60 | 1 | 00001b80 | 60008b00 | 166 | |
| 223 | 109e | fb60 | 1 | 000016e0 | 60008b00 | 166 | |
| 224 | 009c | fb40 | 0 | 00001280 | 01800300 | 168 | 0f |
| 225 | 109e | fb60 | 1 | 00001b80 | 03000600 | 169 | |
| 226 | 109e | fb60 | 1 | 000016e0 | 03000600 | 169 | |
| 227 | 109e | fb60 | 1 | 00001240 | 03000600 | 169 | |
| 228 | 009c | fb40 | 0 | 00001280 | 0bffe180 | 171 | |
| 229 | 109e | fb60 | 1 | 00001b80 | 17ffc300 | 172 | |
| 230 | 109e | fb60 | 1 | 000016e0 | 17ffc300 | 172 | |
| 231 | 009c | fb40 | 0 | 00001280 | 5ffec300 | 174 | |
| 232 | 109e | fb60 | 1 | 00001b80 | bffd8600 | 175 | |
| 233 | 109e | fb60 | 1 | 000016e0 | bffd8600 | 175 | |
| 234 | 109e | fb60 | 1 | 00001240 | bffd8600 | 175 | |
| 235 | 009c | fb40 | 0 | 00001280 | 03002180 | 177 | 0e d7 |
| 236 | 109e | fb60 | 1 | 00001b80 | 06004300 | 178 | |
| 237 | 009c | fb40 | 0 | 00001280 | 1800b080 | 180 | |
| 238 | 109e | fb60 | 1 | 00001b80 | 30016100 | 181 | |
| 239 | 109e | fb60 | 1 | 000016e0 | 30016100 | 181 | |
| 240 | 109e | fb60 | 1 | 00001240 | 30016100 | 181 | |
| 241 | 11a0 | fb80 | 1 | 00001b40 | 6002c200 | 182 | |
| 242 | 11a0 | fb80 | 1 | 000016c0 | 6002c200 | 182 | |
| 243 | 11a0 | fb80 | 1 | 00001240 | 6002c200 | 182 | |
| 244 | 009c | fb40 | 0 | 00001200 | 01801100 | 184 | 56 |
| 245 | 019a | fb00 | 0 | 00001300 | 06000f00 | 186 | |
| 246 | 109c | fb40 | 1 | 00001c00 | 0c001e00 | 187 | |
| 247 | 109c | fb40 | 1 | 00001740 | 0c001e00 | 187 | |
| 248 | 109c | fb40 | 1 | 00001280 | 0c001e00 | 187 | |
| 249 | 119e | fb60 | 1 | 00001b80 | 18003c00 | 188 | |
| 250 | 119e | fb60 | 1 | 000016e0 | 18003c00 | 188 | |
| 251 | 119e | fb60 | 1 | 00001240 | 18003c00 | 188 | |
| 252 | 12a0 | fb80 | 1 | 00001b40 | 30007800 | 189 | |
| 253 | 12a0 | fb80 | 1 | 000016c0 | 30007800 | 189 | |
| 254 | 12a0 | fb80 | 1 | 00001240 | 30007800 | 189 | |
| 255 | 13a2 | fba0 | 1 | 00001b80 | 6000f000 | 190 | |
| 256 | 13a2 | fba0 | 1 | 00001720 | 6000f000 | 190 | |
| x-a | | | | | 6000d8e0 | | |

TABLE 6

Decoder (inverted version):

| ec | I0 | Q0 | YN | A | X | bits | codebytes |
|---|---|---|---|---|---|---|---|
| 0 | 0000 | 0a80 | | 00001000 | 074c9e20 | 0 | |
| 1 | 1180 | f580 | 1 | 00001500 | 03993c40 | 1 | |
| 2 | 1282 | f600 | 1 | 00001500 | 07327880 | 2 | |
| 3 | 1384 | f680 | 1 | 00001600 | 0e644701 | 3 | b8 |
| 4 | 0180 | f580 | 0 | 00001300 | 03c88e02 | 4 | |
| 5 | 1082 | f600 | 1 | 00001100 | 07911c04 | 5 | |
| 6 | 0080 | f580 | 0 | 00001400 | 01223808 | 6 | |
| 7 | 1082 | f600 | 1 | 00001300 | 02447010 | 7 | |
| 8 | 1184 | f680 | 1 | 00001200 | 0488e020 | 8 | |
| 9 | 1286 | f700 | 1 | 00001100 | 0911c040 | 9 | |
| 10 | 0082 | f600 | 0 | 00001200 | 02238080 | 10 | |
| 11 | 1084 | f680 | 1 | 00001000 | 0447fb01 | 11 | 04 |
| 12 | 1186 | f700 | 1 | 00001a00 | 111fec04 | 13 | |
| 13 | 0084 | f680 | 0 | 00001200 | 003fd808 | 14 | |
| 14 | 1086 | f700 | 1 | 00001100 | 007fb010 | 15 | |
| 15 | 1188 | f760 | 1 | 00001000 | 00ff6020 | 16 | |
| 16 | 128a | f840 | 1 | 00001d80 | 03fd8080 | 18 | |
| 17 | 128a | f840 | 1 | 000015c0 | 03fd8080 | 18 | |
| 18 | 138c | f8a0 | 1 | 00001c00 | 07fb6c01 | 19 | 93 |
| 19 | 138c | f8a0 | 1 | 000014a0 | 07fb6c01 | 19 | |
| 20 | 1490 | f940 | 1 | 00001a80 | 0ff6d802 | 20 | |
| 21 | 1490 | f940 | 1 | 000013c0 | 0ff6d802 | 20 | |
| 22 | 028a | f840 | 0 | 00001b00 | 0bdb6008 | 22 | |
| 23 | 028a | f840 | 1 | 00001340 | 0bdb6008 | 22 | |
| 24 | 0386 | f700 | 0 | 00001f00 | 016d8020 | 24 | |
| 25 | 0386 | f700 | 1 | 00001600 | 016d8020 | 24 | |
| 26 | 118a | f840 | 1 | 00001a00 | 02db0040 | 25 | |
| 27 | 118a | f840 | 1 | 00001240 | 02db0040 | 25 | |
| 28 | 128c | f8a0 | 1 | 00001500 | 05b60080 | 26 | |
| 29 | 138e | f900 | 1 | 00001b40 | 0b6c1701 | 27 | |
| 30 | 138e | f900 | 1 | 00001440 | 0b6c1701 | 27 | e8 |
| 31 | 1492 | f980 | 1 | 00001a80 | 16d82e02 | 28 | |
| 32 | 028c | f8a0 | 0 | 00001a00 | 0b60b808 | 30 | |
| 33 | 028c | f8a0 | 1 | 000012a0 | 0b60b808 | 30 | |
| 34 | 0388 | f760 | 0 | 00001d80 | 0082e020 | 32 | |
| 35 | 0388 | f760 | 1 | 000014e0 | 0082e020 | 32 | |
| 36 | 118c | f8a0 | 1 | 00001880 | 0105c040 | 33 | |
| 37 | 118c | f8a0 | 1 | 00001120 | 0105c040 | 33 | |
| 38 | 128e | f900 | 1 | 00001380 | 020b8080 | 34 | |
| 39 | 1390 | f940 | 1 | 00001900 | 0417fe01 | 35 | 01 |
| 40 | 1390 | f940 | 1 | 00001240 | 0417fe01 | 35 | |
| 41 | 1494 | f9c0 | 1 | 00001700 | 082ffc02 | 36 | |
| 42 | 1494 | f9c0 | 1 | 000010c0 | 082ffc02 | 36 | |
| 43 | 1598 | fa80 | 1 | 00001500 | 105ff804 | 37 | |
| 44 | 0392 | f980 | 0 | 00001600 | 037fe010 | 39 | |
| 45 | 1196 | fa00 | 1 | 00001f00 | 06ffc020 | 40 | |
| 46 | 1196 | fa00 | 1 | 00001900 | 06ffc020 | 40 | |
| 47 | 1196 | fa00 | 1 | 00001300 | 06ffc020 | 40 | |
| 48 | 1298 | fa80 | 1 | 00001a00 | 0dff8040 | 41 | |
| 49 | 1298 | fa80 | 1 | 00001480 | 0dff8040 | 41 | |
| 50 | 139a | fb00 | 1 | 00001e00 | 1bff0080 | 42 | |
| 51 | 0194 | f9c0 | 0 | 00001400 | 0bfd3a02 | 44 | 62 |
| 52 | 1096 | fa00 | 1 | 00001b80 | 17fa7404 | 45 | |
| 53 | 0094 | f9c0 | 1 | 00001800 | 09e9d010 | 47 | |
| 54 | 0094 | f9c0 | 1 | 000011c0 | 09e9d010 | 47 | |
| 55 | 1096 | fa00 | 1 | 00001700 | 13d3a020 | 48 | |
| 56 | 0094 | f9c0 | 0 | 00001800 | 0b4e8080 | 50 | |
| 57 | 0094 | f9c0 | 1 | 000011c0 | 0b4e8080 | 50 | |
| 58 | 1096 | fa00 | 1 | 00001700 | 169d8401 | 51 | 7b |
| 59 | 0094 | f9c0 | 0 | 00001800 | 16761004 | 53 | |
| 60 | 0192 | f980 | 0 | 00001900 | 12d84010 | 55 | |
| 61 | 0290 | f940 | 0 | 00001a00 | 01610040 | 57 | |
| 62 | 0290 | f940 | 1 | 00001340 | 01610040 | 57 | |

TABLE 6-continued

Decoder (inverted version):

| ec | 10 | QO | YN | A | X | bits | codebytes |
|---|---|---|---|---|---|---|---|
| 63 | 1092 | f980 | 1 | 00001900 | 02c20080 | 58 | |
| 64 | 1092 | f980 | 1 | 00001280 | 02c20080 | 58 | |
| 65 | 1194 | f9c0 | 1 | 00001800 | 05844c01 | 59 | b3 |
| 66 | 1194 | f9c0 | 1 | 000011c0 | 05844c01 | 59 | |
| 67 | 1296 | fa00 | 1 | 00001700 | 0b089802 | 60 | |
| 68 | 1296 | fa00 | 1 | 00001100 | 0b089802 | 60 | |
| 69 | 0092 | f980 | 0 | 00001800 | 00226008 | 62 | |
| 70 | 0092 | f980 | 1 | 00001180 | 00226008 | 62 | |
| 71 | 1094 | f9c0 | 1 | 00001600 | 0044c010 | 63 | |
| 72 | 1196 | fa00 | 1 | 00001f80 | 00898020 | 64 | |
| 73 | 1196 | fa00 | 1 | 00001980 | 00898020 | 64 | |
| 74 | 1196 | fa00 | 1 | 00001380 | 00898020 | 64 | |
| 75 | 1298 | fa80 | 1 | 00001b00 | 01130040 | 65 | |
| 76 | 1298 | fa80 | 1 | 00001580 | 01130040 | 65 | |
| 77 | 1298 | fa80 | 1 | 00001000 | 01130040 | 65 | |
| 78 | 139a | fb00 | 1 | 00001500 | 02260080 | 66 | |
| 79 | 139a | fb00 | 1 | 00001000 | 02260080 | 66 | |
| 80 | 149e | fb60 | 1 | 00001600 | 044ccb01 | 67 | 34 |
| 81 | 149e | fb60 | 1 | 00001160 | 044ccb01 | 67 | |
| 82 | 15a2 | fba0 | 1 | 00001980 | 08999602 | 68 | |
| 83 | 15a2 | fba0 | 1 | 00001520 | 08999602 | 68 | |
| 84 | 15a2 | fba0 | 1 | 000010c0 | 08999602 | 68 | |
| 85 | 16a6 | fbe0 | 1 | 000018c0 | 11332c04 | 69 | |
| 86 | 16a6 | fbe0 | 1 | 000014a0 | 11332c04 | 69 | |
| 87 | 049c | fb40 | 0 | 00001080 | 02ccb010 | 71 | |
| 88 | 12a0 | fb80 | 1 | 00001780 | 05996020 | 72 | |
| 89 | 12a0 | fb80 | 1 | 00001300 | 05996020 | 72 | |
| 90 | 13a2 | fba0 | 1 | 00001d00 | 0b32c040 | 73 | |
| 91 | 13a2 | fba0 | 1 | 000018a0 | 0b32c040 | 73 | |
| 92 | 13a2 | fba0 | 1 | 00001440 | 0b32c040 | 73 | |
| 93 | 14a6 | fbe0 | 1 | 00001fc0 | 16658080 | 74 | |
| 94 | 14a6 | fbe0 | 1 | 00001ba0 | 16658080 | 74 | |
| 95 | 14a6 | fbe0 | 1 | 00001780 | 16658080 | 74 | |
| 96 | 029e | fb60 | 0 | 00001080 | 0c16d002 | 76 | 97 |
| 97 | 039a | fb00 | 0 | 00001280 | 00db4008 | 78 | |
| 98 | 119e | fb60 | 1 | 00001b00 | 01b68010 | 79 | |
| 99 | 119e | fb60 | 1 | 00001660 | 01b68010 | 79 | |
| 100 | 119e | fb60 | 1 | 000011c0 | 01b68010 | 79 | |
| 101 | 12a0 | fb80 | 1 | 00001a40 | 036d0020 | 80 | |
| 102 | 12a0 | fb80 | 1 | 000015c0 | 036d0020 | 80 | |
| 103 | 12a0 | fb80 | 1 | 00001140 | 036d0020 | 80 | |
| 104 | 13a2 | fba0 | 1 | 00001980 | 06da0040 | 81 | |
| 105 | 13a2 | fba0 | 1 | 00001520 | 06da0040 | 81 | |
| 106 | 13a2 | fba0 | 1 | 000010c0 | 06da0040 | 81 | |
| 107 | 14a6 | fbe0 | 1 | 000018c0 | 0db40080 | 82 | |
| 108 | 14a6 | fbe0 | 1 | 000014a0 | 0db40080 | 82 | |
| 109 | 14a6 | fbe0 | 1 | 00001080 | 0db40080 | 82 | |
| 110 | 029e | fb60 | 0 | 00001080 | 05517a02 | 84 | 42 |
| 111 | 10a0 | fb80 | 1 | 000017c0 | 0aa2f404 | 85 | |
| 112 | 10a0 | fb80 | 1 | 00001340 | 0aa2f404 | 85 | |
| 113 | 11a2 | fba0 | 1 | 00001d80 | 1545e808 | 86 | |
| 114 | 11a2 | fba0 | 1 | 00001920 | 1545e808 | 86 | |
| 115 | 00a0 | fb80 | 0 | 00001180 | 0217a020 | 88 | |
| 116 | 10a2 | fba0 | 1 | 00001a00 | 042f4040 | 89 | |
| 117 | 10a2 | fba0 | 1 | 000015a0 | 042f4040 | 89 | |
| 118 | 10a2 | fba0 | 1 | 00001140 | 042f4040 | 89 | |
| 119 | 11a4 | fbc0 | 1 | 000019c0 | 085e8080 | 90 | |
| 120 | 11a4 | fbc0 | 1 | 00001580 | 085e8080 | 90 | |
| 121 | 11a4 | fbc0 | 1 | 00001140 | 085e8080 | 90 | |
| 122 | 12a6 | fbe0 | 1 | 00001a00 | 10bdb301 | 91 | 4c |
| 123 | 12a6 | fbe0 | 1 | 000015e0 | 10bdb301 | 91 | |
| 124 | 12a6 | fbe0 | 1 | 000011c0 | 10bdb301 | 91 | |
| 125 | 00a0 | fb80 | 0 | 00001080 | 0c76cc04 | 93 | |
| 126 | 019c | fb40 | 0 | 00001200 | 01db3010 | 95 | |
| 127 | 109e | fb60 | 1 | 00001a80 | 03b66020 | 96 | |
| 128 | 109e | fb60 | 1 | 000015e0 | 03b66020 | 96 | |
| 129 | 109e | fb60 | 1 | 00001140 | 03b66020 | 96 | |
| 130 | 11a0 | fb80 | 1 | 00001940 | 076cc040 | 97 | |
| 131 | 11a0 | fb80 | 1 | 000014c0 | 076cc040 | 97 | |
| 132 | 11a0 | fb80 | 1 | 00001040 | 076cc040 | 97 | |
| 133 | 12a2 | fba0 | 1 | 00001780 | 0ed98080 | 98 | |
| 134 | 12a2 | fba0 | 1 | 00001320 | 0ed98080 | 98 | |
| 135 | 009e | fb60 | 0 | 00001180 | 00678402 | 100 | 3d |
| 136 | 10a0 | fb80 | 1 | 000019c0 | 00cf0804 | 101 | |
| 137 | 10a0 | fb80 | 1 | 00001540 | 00cf0804 | 101 | |
| 138 | 10a0 | fb80 | 1 | 000010c0 | 00cf0804 | 101 | |
| 139 | 11a2 | fba0 | 1 | 00001880 | 019e1008 | 102 | |
| 140 | 11a2 | fba0 | 1 | 00001420 | 019e1008 | 102 | |
| 141 | 12a4 | fbc0 | 1 | 00001f80 | 033c2010 | 103 | |
| 142 | 12a4 | fbc0 | 1 | 00001b40 | 033c2010 | 103 | |
| 143 | 12a4 | fbc0 | 1 | 00001700 | 033c2010 | 103 | |
| 144 | 12a4 | fbc0 | 1 | 000012c0 | 033c2010 | 103 | |
| 145 | 13a6 | fbe0 | 1 | 00001d00 | 06784020 | 104 | |
| 146 | 13a6 | fbe0 | 1 | 000018e0 | 06784020 | 104 | |
| 147 | 13a6 | fbe0 | 1 | 000014c0 | 06784020 | 104 | |
| 148 | 13a6 | fbe0 | 1 | 000010a0 | 06784020 | 104 | |
| 149 | 14aa | fc80 | 1 | 00001900 | 0cf08040 | 105 | |
| 150 | 14aa | fc80 | 1 | 00001580 | 0cf08040 | 105 | |
| 151 | 14aa | fc80 | 1 | 00001200 | 0cf08040 | 105 | |
| 152 | 15ae | fd00 | 1 | 00001d00 | 19e10080 | 106 | |
| 153 | 15ae | fd00 | 1 | 00001a00 | 19e10080 | 106 | |
| 154 | 03a8 | fc40 | 0 | 00001800 | 170a8804 | 109 | 5d |
| 155 | 04a4 | fbc0 | 0 | 00001e00 | 16544020 | 112 | |
| 156 | 04a4 | fbc0 | 1 | 000019c0 | 16544020 | 112 | |
| 157 | 059c | fb40 | 0 | 00001100 | 03510080 | 114 | |
| 158 | 13a0 | fb80 | 1 | 00001880 | 06a2d401 | 115 | 2b |
| 159 | 13a0 | fb80 | 1 | 00001400 | 06a2d401 | 115 | |
| 160 | 14a4 | fbc0 | 1 | 00001f00 | 0d45a802 | 116 | |
| 161 | 14a4 | fbc0 | 1 | 00001ac0 | 0d45a802 | 116 | |
| 162 | 14a4 | fbc0 | 1 | 00001680 | 0d45a802 | 116 | |
| 163 | 14a4 | fbc0 | 1 | 00001240 | 0d45a802 | 116 | |
| 164 | 15a8 | fc40 | 1 | 00001c00 | 1a8b5004 | 117 | |
| 165 | 03a2 | fba0 | 0 | 00001e00 | 125a8020 | 120 | |
| 166 | 03a2 | fba0 | 1 | 000019a0 | 125a8020 | 120 | |
| 167 | 03a2 | fba0 | 1 | 00001540 | 125a8020 | 120 | |
| 168 | 049e | fb60 | 0 | 00001180 | 05ea0080 | 122 | |
| 169 | 12a2 | fba0 | 1 | 000019c0 | 0bd49f01 | 123 | 60 |
| 170 | 12a2 | fba0 | 1 | 00001560 | 0bd49f01 | 123 | |
| 171 | 12a2 | fba0 | 1 | 00001100 | 0bd49f01 | 123 | |
| 172 | 13a4 | fbc0 | 1 | 00001940 | 17a93e02 | 124 | |
| 173 | 019e | fb60 | 0 | 00001100 | 0aa4f808 | 126 | |
| 174 | 10a0 | fb80 | 1 | 000018c0 | 1549f010 | 127 | |
| 175 | 009c | fb40 | 0 | 00001200 | 0427c040 | 129 | |
| 176 | 109e | fb60 | 1 | 00001a80 | 084f8080 | 130 | |
| 177 | 109e | fb60 | 1 | 000015e0 | 084f8080 | 130 | |
| 178 | 109e | fb60 | 1 | 00001140 | 084f8080 | 130 | |
| 179 | 11a0 | fb80 | 1 | 00001940 | 109f2d01 | 131 | d2 |
| 180 | 11a0 | fb80 | 1 | 000014c0 | 109f2d01 | 131 | |
| 181 | 009c | fb40 | 0 | 00001200 | 017cb404 | 133 | |
| 182 | 109e | fb60 | 1 | 00001a80 | 02f96808 | 134 | |
| 183 | 109e | fb60 | 1 | 000015e0 | 02f96808 | 134 | |
| 184 | 109e | fb60 | 1 | 00001140 | 02f96808 | 134 | |
| 185 | 11a0 | fb80 | 1 | 00001940 | 05f2d010 | 135 | |
| 186 | 11a0 | fb80 | 1 | 000014c0 | 05f2d010 | 135 | |
| 187 | 11a0 | fb80 | 1 | 00001040 | 05f2d010 | 135 | |
| 188 | 12a2 | fba0 | 1 | 00001780 | 0be5a020 | 136 | |
| 189 | 12a2 | fba0 | 1 | 00001320 | 0be5a020 | 136 | |
| 190 | 13a4 | fbc0 | 1 | 00001d80 | 17cb4040 | 137 | |
| 191 | 13a4 | fbc0 | 1 | 00001940 | 17cb4040 | 137 | |
| 192 | 019e | fb60 | 0 | 00001100 | 0b2d6201 | 139 | 9d |
| 193 | 10a0 | fb80 | 1 | 000018c0 | 165ac402 | 140 | |
| 194 | 009c | fb40 | 0 | 00001200 | 086b1008 | 142 | |
| 195 | 109e | fb60 | 1 | 00001a80 | 10d62010 | 143 | |
| 196 | 109e | fb60 | 1 | 000015e0 | 10d62010 | 143 | |
| 197 | 109e | fb60 | 1 | 00001140 | 10d62010 | 143 | |
| 198 | 009c | fb40 | 0 | 00001280 | 10d88040 | 145 | |
| 199 | 019a | fb00 | 0 | 00001300 | 0c62f101 | 147 | 0e |
| 200 | 109c | fb40 | 1 | 00001c00 | 18c5e202 | 148 | |
| 201 | 009a | fb00 | 0 | 00001300 | 06178808 | 150 | |
| 202 | 109c | fb40 | 1 | 00001c00 | 0c2f1010 | 151 | |
| 203 | 109c | fb40 | 1 | 00001740 | 0c2f1010 | 151 | |
| 204 | 109c | fb40 | 1 | 00001280 | 0c2f1010 | 151 | |
| 205 | 119e | fb60 | 1 | 00001b80 | 185e2020 | 152 | |
| 206 | 009c | fb40 | 0 | 00001280 | 05f88080 | 154 | |
| 207 | 109e | fb60 | 1 | 00001b80 | 0bf12801 | 155 | |
| 208 | 109e | fb60 | 1 | 000016e0 | 0bf12801 | 155 | |
| 209 | 109e | fb60 | 1 | 00001240 | 0bf12801 | 155 | |
| 210 | 11a0 | fb80 | 1 | 00001b40 | 17e25002 | 156 | |
| 211 | 009c | fb40 | 0 | 00001200 | 04894008 | 158 | |
| 212 | 109e | fb60 | 1 | 00001a80 | 09128010 | 159 | d7 |
| 213 | 109e | fb60 | 1 | 000015e0 | 09128010 | 159 | |
| 214 | 109e | fb60 | 1 | 00001140 | 09128010 | 159 | |
| 215 | 11a0 | fb80 | 1 | 00001940 | 12250020 | 160 | |
| 216 | 11a0 | fb80 | 1 | 000014c0 | 12250020 | 160 | |
| 217 | 009c | fb40 | 0 | 00001200 | 07940080 | 162 | |
| 218 | 109e | fb60 | 1 | 00001a80 | 0f28a901 | 163 | 56 |
| 219 | 109e | fb60 | 1 | 000015e0 | 0f28a901 | 163 | |
| 220 | 109e | fb60 | 1 | 00001140 | 0f28a901 | 163 | |

TABLE 6-continued

Decoder (inverted version):

| ec | I0 | Q0 | YN | A | X | bits | codebytes |
|---|---|---|---|---|---|---|---|
| 221 | 009c | fb40 | 0 | 00001280 | 0a22a404 | 165 | |
| 222 | 109e | fb60 | 1 | 00001b80 | 14454808 | 166 | |
| 223 | 109e | fb60 | 1 | 000016e0 | 14454808 | 166 | |
| 224 | 009c | fb40 | 0 | 00001280 | 08152020 | 168 | |
| 225 | 109e | fb60 | 1 | 00001b80 | 102a4040 | 169 | |
| 226 | 109e | fb60 | 1 | 000016e0 | 102a4040 | 169 | |
| 227 | 109e | fb60 | 1 | 00001240 | 102a4040 | 169 | |
| 228 | 009c | fb40 | 0 | 00001280 | 0a29e401 | 171 | 1b |
| 229 | 109e | fb60 | 1 | 00001b80 | 1453c802 | 172 | |
| 230 | 109e | fb60 | 1 | 000016e0 | 1453c802 | 172 | |
| 231 | 009c | fb40 | 0 | 00001280 | 084f2008 | 174 | |
| 232 | 109e | fb60 | 1 | 00001b80 | 109e4010 | 175 | |
| 233 | 109e | fb60 | 1 | 000016e0 | 109e4010 | 175 | |
| 234 | 109e | fb60 | 1 | 00001240 | 109e4010 | 175 | |
| 235 | 009c | fb40 | 0 | 00001280 | 0bf90040 | 177 | |
| 236 | 109e | fb60 | 1 | 00001b80 | 17f20080 | 178 | |
| 237 | 009c | fb40 | 0 | 00001280 | 0449c602 | 180 | 1c |
| 238 | 109e | fb60 | 1 | 00001b80 | 08938c04 | 181 | |
| 239 | 109e | fb60 | 1 | 000016e0 | 08938c04 | 181 | |
| 240 | 109e | fb60 | 1 | 00001240 | 08938c04 | 181 | |
| 241 | 11a0 | fb80 | 1 | 00001b40 | 11271808 | 182 | |
| 242 | 11a0 | fb80 | 1 | 000016c0 | 11271808 | 182 | |
| 243 | 11a0 | fb80 | 1 | 00001240 | 11271808 | 182 | |
| 244 | 009c | fb40 | 0 | 00001200 | 0d9c6020 | 184 | |
| 245 | 019a | fb00 | 0 | 00001300 | 01718080 | 186 | |
| 246 | 109c | fb40 | 1 | 00001c00 | 02e3ff01 | 187 | 00 |
| 247 | 109c | fb40 | 1 | 00001740 | 02e3ff01 | 187 | |
| 248 | 109c | fb40 | 1 | 00001280 | 02e3ff01 | 187 | |
| 249 | 119e | fb60 | 1 | 00001b80 | 05c7fe02 | 188 | |
| 250 | 119e | fb60 | 1 | 000016e0 | 05c7fe02 | 188 | |
| 251 | 119e | fb60 | 1 | 00001240 | 05c7fe02 | 188 | |
| 252 | 12a0 | fb80 | 1 | 00001b40 | 0b8ffc04 | 189 | |
| 253 | 12a0 | fb80 | 1 | 000016c0 | 0b8ffc04 | 189 | |
| 254 | 12a0 | fb80 | 1 | 00001240 | 0b8ffc04 | 189 | |
| 255 | 13a2 | fba0 | 1 | 00001b80 | 171ff808 | 190 | |
| 256 | 13a2 | fba0 | 1 | 00001720 | 171ff808 | 190 | |

What we claimed as our invention is:

1. A computerized method of selectively adapting the value of an estimated probability $Q_e$, in response to the inputting to a computer of an outcome event corresponding to a decision, wherein the value of $Q_e$ corresponds to the estimated probability of a $Q_e$ event and a $Q_e$ event is one of at least two possible outcome events that may be inputted, the method comprising the steps of:

selecting and storing in the computer (i) an augend having a value A and (ii) a value qe for the estimated probability $Q_e$;

providing a plurality of said possible outcome events as input to the computer and generating respective signals indicative thereof;

changing the stored augend value A to equal a value A' derived from the selected value A and the selected value qe in response to the generation of a signal indicative of a $Q_e$ event;

changing the stored augend value A to equal a value A" derived from the selected value A and a value equal to (1 - the selected value qe of $Q_e$), in response to the generation of a signal indicative of an outcome event that is other than a $Q_e$ event;

comparing the changed augend value, A' or A", to a prescribed minimum value AMIN, and generating a signal indicating when said changed augend value is less than AMIN;

renormalizing the changed augend value to increase the value thereof to A'''>AMIN in response to said signal indicating that said changed value is less than said prescribed minimum value AMIN;

up-dating the value of qe to qe', in response to the renormalization of the augend value;

repeating the above-recited steps using the values A' or A" and qe as the stored values, and substituting the values A''' and qe' as the stored values in response to a renormalization; and continuing said repetition accordingly using continuously changing stored augend values and estimated probability values in response to the continuing input of said possible outcome events.

2. The method of claim 1 comprising the further step of:

storing a table of selectable $Q_e$ values in a memory; and wherein the current value for $Q_e$ at any given time is a value from the table and said up-dating step includes selecting a prescribed table value which becomes the current $Q_e$ value.

3. The method of claim 2 wherein the $Q_e$ value corresponds to a less probable binary decision event and the $Q_e$ value up-dating step includes the steps of:

choosing a large-in-value $Q_e$ value from the table in response to signals indicative of a less probable binary decision event being entered as the next input and the changed augend value being less than AMIN; and choosing a lower-in-value $Q_e$ value from the table in response to signals indicative of a more probable binary decision event being entered as the next input and the changed augend value being less than AMIN.

4. The method of claim 3 wherein said table storing step includes:

assigning $Q_e$ values for the table in which each value after renormalization to a value greater than AMIN is at least a prescribed value δ greater than AMIN.

5. The method of claim 3 wherein said table storing step includes:

assigning $Q_e$ values for the table to converge (i) the actual probability of the less probable event and (ii) the estimated probability $Q_e$.

6. The method of claim 5 wherein said table storing step includes:

assigning $Q_e$ values for the table in which each value after renormalization to a value greater than AMIN is at least a prescribed value δ greater than AMIN.

7. The method of claim 3 wherein the current augend value A is changed in value to equal (a) the value of $Q_e$, in response to a signal indicating that the less probable event is entered as input, and (b) A - the value of $Q_e$, in response to a signal indicating that the more probable event is entered as input, where the value of $Q_e$, is the most recent current value thereof, and wherein the $Q_e$ value up-dating step includes the steps of:

choosing a larger-in-value $Q_e$ value from the table in response to a signal indicating a less probable decision event input; and choosing a lower-in-value $Q_e$ value from the table in response to a signal indicating a more probable decision event input which results in the changed value of A being less than AMIN.

8. The method of claim 2 comprising the further step of:

for each entry in the table, specifying which $Q_e$ values can be chosen as succeeding values.

9. The method of claim 8 wherein said specifying step includes the steps of:
for each of at least some $Q_e$ values in the table, identifying a plurality of selectable succeeding $Q_e$ values one of which becomes the current $Q_e$ value in response to a selected one of the two binary decision events being entered as input.

10. The method of claim 9 wherein the $Q_e$ up-dating step includes the step of:
adjusting the $Q_e$ value in correspondence with a renormalization correlation that represents the repetitive occurrence of LPS renormalization events and the repetitive occurrence of MPS renormalization events.

11. The method of claim 10 wherein the $Q_e$ adjusting step includes the steps of:
indexing a counter in a first direction when an LPS renormalization follows an LPS renormalization or an MPS renormalization follows an MPS renormalization; and
indexing the counter in the opposite direction when an LPS or an MPS renormalization follows an MPS or an LPS renormalization, respectively.

12. The method of claim 11 wherein the indexing in said opposite direction is at twice the rate as the indexing in said first direction.

13. The method of claim 10 comprising the further step of:
representing the $Q_e$ table as a finite state machine in which each of at least some $Q_e$ table entries has a plurality of states corresponding thereto, each state in the plurality indicating and being selected according to a corresponding renormalization correlation history.

14. The method of claim 8 wherein said specifying step includes the steps of:
for each of at least some of the $Q_e$ values in the table, identifying a single succeeding $Q_e$ value which is selected as the current $Q_e$ value in response to renormalization after a first of the two possible binary decision events being entered as input.

15. The method of claim 8 wherein said specifying step further includes the steps of:
for each $Q_e$ value in the table, identifying a first succeeding $Q_e$ value which is selected as the current $Q_e$ value if a first of the two binary decision events is entered as input; and
for each $Q_e$ value in the table, identifying a second succeeding $Q_e$ value which is selected as the current $Q_e$ value if the other possible binary event is entered as input.

16. The method of claim 1 comprising the further step of:
defining a plurality of contexts, each having a corresponding current $Q_e$ value in the stored table; and
wherein said up-dating step includes the step of:
up-dating the corresponding current $Q_e$ value for a respective context in response to a signal indicative of an inputted outcome event resulting in a renormalization in said respective context.

17. The method of claim 16 wherein the augent value at a given time is common to all contexts at said given time.

18. The method of claim 16 wherein each context has a respective augend value assigned thereto.

19. The method of claim 1 where AMIN is 0.75 and wherein said up-dating step includes the step of: changing the $Q_e$ value whenever the value augend is less than 0.75.

20. In a computerized arithmetic coding system in which a stored augend value A is renormalized in response to the (a) the entering of a less probable binary decision event (LPS) input which reduces A below a prescribed minimum value AMIN1, or (b) the entering of a more probable binary decision event (MPS) input which reduces A below a prescribed minimum value AMIN2, apparatus for adapting the value of the probability of the input of one of the two possible binary decision events after successive binary decision event inputs comprising:
means for detecting when the augend value A is renormalized and producing a signal indicative thereof; and
means for up-dating the probability value of said one binary decision event in response to an indicative signal each time an augend renormalization is detected.

21. The apparatus of claim 20 further comprising:
table means for storing selectable values for the probability of said one binary decision event; and
pointer means for identifying a current probability value in said table means; and
wherein said up-dating means includes:
means for moving said pointer means to a higher-in-value entry in said table means in response to a renormalization normalization after the input of one of the two possible binary decision events and to a lower-in-value entry in response to a renormalization after the input of the other of the two possible binary decision events.

22. The apparatus of claim 21 wherein said table means comprises: a finite state machine wherein the respective preceding entries and succeeding entries for each table entry are specified.

23. The apparatus of claim 21 wherein binary decisions in differing contexts are processed together, and further comprising:
means for recognizing the context in which a binary decision even is produced; and wherein
said pointer means comprises a plurality of pointers, each pointer identifying a respective value in said table means for each context; and
means included in said pointer moving means for repositioning the pointer corresponding to the recognized context.

24. The apparatus of claim 21 further comprising:
means for varying the rate of pointer movement according to a measure of renormalization correlation.

25. The apparatus of claim 21 wherein said table means comprises:
a first stored table including a list of probability value entries and, for each entry therein, a corresponding index which identifies a higher succeeding probability value and the corresponding index thereof; and
a second stored table including a list of probability value entries and, for each entry therein, a corresponding index which identifies a lower succeeding probability value and the corresponding index thereof;
and further comprising:
means for up-dating the probability value to the identified higher value entry in said first table in response to are normalization following the input of a first type of decision event, and for up-dating the probability value to the identified lower value entry in said second table in response to a renormalization following the input of a second type of decision event.

26. In a data processing system in which first and second types of decision events are input thereto, and wherein a current interval along a probability number line is divided into
   (a) a lesser-included first interval which becomes the current interval when a first type of decision event is entered as the next input, and
   (b) a lesser-included second interval which becomes the current interval when a second type of decision event is entered as the next input,
   with the length of the first interval corresponding to a a value indicative of a first estimated probability of the first type of event being entered as the next input, and the length of the second interval corresponding to a probability associated with the second type of decision event being entered as the next input, and in which the value A of the length of the current interval is stored in memory during the inputting of successive decision events and is renormalized to increase the value thereof when it becomes less than a prescribed minimum value AMIN, a method of selectively adapting the first estimated probability value in response to decision event inputs, comprising the steps of:

storing a table of selectable first estimated probability values in a memory;

selecting as a current first estimated probability value, one of the first probability values in the table; and up-dating the current first estimated probability value to a prescribed table value which becomes the current first probability value in response to the renormalization of the current interval value A.

* * * * *